(12) United States Patent
Koseoglu et al.

(10) Patent No.: US 11,935,827 B2
(45) Date of Patent: Mar. 19, 2024

(54) CATALYSTS WITH MODIFIED ACTIVE PHASE DISPERSION AND METHOD TO PREPARE CATALYSTS WITH MODIFIED ACTIVE PHASE DISPERSION

(71) Applicants: Saudi Arabian Oil Company, Dhahran (SA); JGC Catalysts & Chemicals Ltd., Kawasaki Kanagawa (JP); Japan Cooperation Center for Petroleum and Sustainable Energy, Tokyo (JP)

(72) Inventors: Omer Refa Koseoglu, Dhahran (SA); Robert Peter Hodgkins, Dhahran (SA); Koji Uchida, Kanagawa (JP)

(73) Assignees: Saudi Arabian Oil Company, Dhahran (SA); JGC Catalysts & Chemicals Ltd., Kawasaki Kanagawa (JP); Japan Cooperation Center for Petroleum and Sustainable Energy, Tokyo (JP)

( * ) Notice: Subject to any disclaimer, the term of this patent is extended or adjusted under 35 U.S.C. 154(b) by 20 days.

(21) Appl. No.: 17/577,794

(22) Filed: Jan. 18, 2022

(65) Prior Publication Data

US 2023/0226532 A1   Jul. 20, 2023

(51) Int. Cl.
  *B01J 29/76*   (2006.01)
  *B01J 37/00*   (2006.01)
  (Continued)

(52) U.S. Cl.
  CPC .......... *H01L 23/5223* (2013.01); *B01J 29/76* (2013.01); *B01J 35/617* (2024.01); *B01J 35/643* (2024.01);
  (Continued)

(58) Field of Classification Search
  CPC .... B01J 29/76; B01J 35/1023; B01J 35/1057; B01J 35/1061; B01J 35/1066;
  (Continued)

(56) References Cited

U.S. PATENT DOCUMENTS 3,677,972 A    7/1972  Gutbelet et al.
4,980,328 A   12/1990  Kukes et al.
  (Continued)

FOREIGN PATENT DOCUMENTS

CN   104923291 A    9/2015
EP     0626991 B1  12/1994
  (Continued)

OTHER PUBLICATIONS

Lekhal, A., et al., 2007, "Chapter 16: Drying of Supported Catalysts" in Catalyst Preparation: Science and Engineering, CRC Press, 488 pp. [Office action cites p. 380]. (Year: 2007).*
  (Continued)

*Primary Examiner* — Brian A McCaig
(74) *Attorney, Agent, or Firm* — Leason Ellis LLP

(57) ABSTRACT

Catalyst particles comprising one or more active metal components and methods for manufacturing such catalyst particles are provided. The particles are a composite of a granulating agent or binder material such as an inorganic oxide, and an ultra-stable Y (hereafter "USY") zeolite in which some of the aluminum atoms in the framework are substituted with zirconium atoms and/or titanium atoms and/or hafnium atoms. The one or more active phase components are incorporated in a composite mixture of the inorganic oxide binder and the post-framework modified USY zeolite prior to forming the catalyst particles.

20 Claims, 5 Drawing Sheets

(51) Int. Cl.
  *B01J 37/02* (2006.01)
  *B01J 37/04* (2006.01)
  *B01J 37/08* (2006.01)
  *H01L 23/522* (2006.01)
  *H01L 23/58* (2006.01)
  *H01L 49/02* (2006.01)

(52) U.S. Cl.
  CPC .......... *B01J 35/647* (2024.01); *B01J 35/651* (2024.01); *B01J 37/0009* (2013.01); *B01J 37/0207* (2013.01); *B01J 37/04* (2013.01); *B01J 37/082* (2013.01); *H01L 23/585* (2013.01); *H01L 28/87* (2013.01); *H01L 28/91* (2013.01); *B01J 2229/183* (2013.01); *B01J 2229/42* (2013.01)

(58) Field of Classification Search
  CPC .... B01J 37/0009; B01J 37/0207; B01J 37/04; B01J 37/082; B01J 2229/183; B01J 2229/42
  See application file for complete search history.

(56) References Cited

U.S. PATENT DOCUMENTS

| | | | |
|---|---|---|---|
| 5,620,590 | A | 4/1997 | Absil et al. |
| 9,221,036 | B2 | 12/2015 | Koseoglu et al. |
| 10,081,009 | B2 | 9/2018 | Koseoglu et al. |
| 10,293,332 | B2 | 5/2019 | Koseoglu et al. |
| 10,787,618 | B2 | 9/2020 | Koseoglu et al. |
| 2013/0175202 | A1* | 7/2013 | Koseoglu ............ B01J 37/0201 502/67 |
| 2015/0159095 | A1 | 6/2015 | Zhan |
| 2019/0224653 | A1* | 7/2019 | Koseoglu ................ B01J 23/40 |
| 2021/0077985 | A1 | 3/2021 | Hodgkins et al. |
| 2021/0246381 | A1 | 8/2021 | Koseoglu |
| 2021/0246382 | A1 | 8/2021 | Koseoglu |
| 2021/0246383 | A1 | 8/2021 | Koseoglu |
| 2021/0246385 | A1 | 8/2021 | Koseoglu |
| 2021/0246386 | A1 | 8/2021 | Koseoglu |
| 2021/0246387 | A1 | 8/2021 | Koseoglu |
| 2021/0246388 | A1 | 8/2021 | Koseoglu |
| 2021/0246389 | A1 | 8/2021 | Koseoglu |

FOREIGN PATENT DOCUMENTS

| | | |
|---|---|---|
| GB | 1189850 | 4/1970 |
| JP | 2214544 A | 8/1990 |
| JP | 2003226519 A | 8/2003 |
| WO | 2019147345 A1 | 8/2019 |
| WO | 2022010520 A1 | 1/2022 |

OTHER PUBLICATIONS

Azkaar et al. "Hydrocracking of hexadecane to jet fuel components over hierarchical Ru-modified faujasite zeolite." Fuel 278 (2020): 118193. 13 pages.

Cui et al. "Performance of Zr-and P-modified USY-based catalyst in hydrocracking of vacuum gas oil." Fuel Processing Technology 106 (2013): 439-446.

Isoda et al. "Reactivity and selectivity for the hydrocracking of vacuum gas oil over metal-loaded and dealuminated Y-zeolites." Energy & fuels 12.3 (1998): 493-502.

Kemp et al. "Hydrogel-derived catalysts. Laboratory results on nickel-molybdenum and cobalt-molybdenum hydrotreating catalysts." Applied Catalysis A: General 134.2 (1996): 299-317.

International Search Report and Written Opinion for corresponding International Patent Application No. PCT/US23/60708 dated May 8, 2023. 7 pages.

* cited by examiner

CATALYSTS WITH MODIFIED ACTIVE PHASE DISPERSION AND METHOD TO PREPARE CATALYSTS WITH MODIFIED ACTIVE PHASE DISPERSION

RELATED APPLICATIONS

Not applicable.

BACKGROUND

Field of the Invention

The present disclosure relates to catalyst manufacturing processes including zeolite of the USY-type.

Description of Related Art

Catalysts including hydrotreating/hydrocracking catalysts, such as pretreat catalysts, typically comprise an amorphous based catalyst(s), such as amorphous alumina or silica-alumina or titania substrates containing active metals, Ni/Mo. Ni/W or Co/Mo metals as the active phase, or amorphous catalyst, zeolite catalyst, or a composite mixture thereof, promoted with Ni, W, Mo and Co metals. A commonly used zeolite is USY. The hydrocracking cracking catalysts include a hydrogenative-active metal component and an acidic support component. In certain embodiments, hydrocracking catalyst includes any one of amorphous alumina catalysts, amorphous silica-alumina catalysts, titania catalysts natural or synthetic zeolite based catalyst, a post modified zeolite, or a combination thereof. The hydrocracking catalyst can possess an active phase material including, in certain embodiments, any one of or combination including Ni, W, Mo, Co or a combination thereof. In other embodiments, typically in sulfur-free environments for hydrogenation and/or reforming, the catalyst may include one or more noble metals such as Ru, Rh, Pd, Ag, Os, Ir. Pt, or Au. In certain embodiments in which an objective is hydrodenitrogenation, acidic alumina or silica alumina based catalysts loaded with Ni—Mo, or Ni—W active metals, or combinations thereof, are used. In embodiments in which the objective is to remove all nitrogen and to increase the conversion of hydrocarbons, silica alumina, zeolite or combination thereof are used as catalysts, with active metals including Ni—Mo, Ni—W or combinations thereof.

U.S. Pat. Nos. 9,221,036, 10,081,009 and 10,293,332 (the '036, '009 and '332 patents, or the '036 patent family), which are owned by the Applicants of the present invention and are incorporated by reference in their entireties, teach, inter alia, hydrocracking catalysts in which a USY framework has been substituted, in part, by one or more of zirconium, titanium, and hafnium. In these catalysts, the substituting metal (Ti, Zr, and/or Hf) substitutes for part of the aluminum in the aluminum/silica framework, and essentially become part of the framework. Processes for making these catalysts and their use, are all described in the '036, '009 and '332 patents.

Hydroprocessing (hydrotreating and hydrocracking) catalysts can be manufactured by a variety of methods. The method chosen usually represents a balance between manufacturing cost and the degree to which the desired chemical and physical properties are achieved. Although there is a relationship between catalyst formulation, preparation procedure, and catalyst properties, the details of that relationship are not always well understood due to the complex nature of the catalyst systems. The chemical composition of the catalyst plays a critical role in its performance; the physical and mechanical properties also play a major role. The preparation of hydrocracking catalysts involves several steps: precipitation, filtration (decantation, centrifugation), washing, drying, forming, calcination, and impregnation. Other steps, such as kneading/mulling, grinding, and sieving, are also typically required. Described below are the steps that are an integral part of hydrocracking catalyst manufacturing processes.

Precipitation involves the mixing of solutions or suspension of materials, resulting in the formation of a precipitate, which may be crystalline or amorphous. Kneading/mulling of wet solid materials usually leads to the formation of dough that is subsequently formed and dried. The kneaded/mulled product is subjected to thermal treatment in order to obtain a more intimate contact between components and better homogeneity by thermal diffusion and solid-state reactions. The metal component is subsequently added by impregnation or incipient wetting methods.

The support characteristics determine the mechanical properties of the catalyst, such as attrition resistance, hardness, and crushing strength. High surface area and proper pore-size distribution are generally required. The pore-size distribution and other physical properties of a catalyst support prepared by precipitation are also affected by the precipitation and the aging conditions of the precipitate as well as by subsequent drying, forming, and calcining.

The final shape and size of catalyst particles are determined in the manufacturing step. Catalysts and catalyst supports are formed into several possible shapes such as spheres, cylindrical extrudates, or shaped forms such as a trilobes or a quadrilobes. Spherical catalyst support catalyst can be obtained by "oil dropping," whereby precipitation occurs upon the pouring of a liquid into a second immiscible liquid. Other spherical processes include marmurizing. Generally, because of cost and process considerations such as pressure drop, the majority of catalysts are currently formed in shapes other than spheres. Fewer spherical catalysts are used in modern hydrocracking. Non spherical shapes are obtained by mixing raw materials to form an extrudable dough which is extruded through a die with perforations. The spaghetti extrudate is dried, calcined, and broken into short pieces. The typical length to diameter ratio of the catalyst base varies, for instance, between 2 and 4.

FIG. 1 shows typical hydrocracking catalyst manufacturing steps: mixing and kneading a binder component and a zeolite component; extruding the kneaded composite mixture and forming into composite particles; calcining the composite particles; impregnating the calcined composite particles with an active metal component, and calcining the impregnated composite particles to form the final catalyst product.

Examples of the shapes of the catalysts and catalyst supports are shown in FIG. 2. The simplest form is cylindrical, but other forms such as trilobes, twisted trilobes, or quadrilobes are also commercially used. Catalysts with multilobed cross sections have a higher surface-to-volume ratio than simple cylindrical extrudates. When used in a fixed bed, these shaped catalyst particles help reduce diffusion resistance, create a more open bed, and reduce pressure drop.

Thermal treatment is applied either before and/or after impregnation of the formed catalyst. For catalyst support materials prepared by precipitation or co-mulling of all the components, only drying may be required prior to forming, with subsequent calcination of the formed product. Thermal treatment of the catalyst or support eliminates water and other volatile matter. The drying and calcination conditions are of critical importance in determining the physical as well as catalytic properties of the catalyst support material. Surface area, pore-size distribution, stability, attrition resistance, crush strength, and the catalytic activity are affected by the drying and calcination conditions.

In conventional catalyst preparation, several methods may be used to add the active metals to the catalyst support material: (a) immersion (dipping), (b) incipient wetness, and (c) evaporative. In one method, a calcined catalyst support material is immersed in an excess of solution containing active metals or metal compounds. The solution fills the pores and is also adsorbed on the support surface, and excess solution is removed. In another method, impregnation is carried out using incipient wetness by tumbling or spraying the activated support with a volume of solution having a concentration of metal compound tailored to achieve the targeted metal level, equal to or slightly less than the pore volume of the support. The metal-loaded catalyst support material is then dried and calcined Metal oxides are formed in the process; the calcination step is also referred to as oxidation. In another method, evaporative impregnation, the catalyst support material is saturated with water or with acid solution and immersed into the aqueous solution containing the metal compound. That compound subsequently diffuses into the pores of the catalyst support material through the aqueous phase. The catalyst after calcination are bagged and shipped-out to the final destinations.

In the '036 patent family, the active metal component is added after the post-framework modified USY zeolite and the binder are mixed, kneaded, and extruded. While the catalyst particles produced by the methodology taught in the '036 patent family are suitable for their intended purposes, the industry is constantly seeking improved catalyst particles and methods of manufacture thereof.

SUMMARY OF THE INVENTION

Catalyst particles comprising one or more active metal components and methods for manufacturing such catalyst particles are provided. The particles are a composite of a granulating agent or binder material such as an inorganic oxide, and an ultra-stable Y (hereafter "USY") zeolite in which some of the aluminum atoms in the framework are substituted with zirconium atoms and/or titanium atoms and/or hafnium atoms. The one or more active phase components are incorporated in a composite mixture of the inorganic oxide binder and the post-framework modified USY zeolite prior to forming the catalyst particles.

A method for making catalyst particles comprises: providing post-framework modified ultra-stable Y-type (USY) zeolite in which a portion of aluminum atoms constituting a zeolite framework thereof is substituted with zirconium atoms and/or titanium atoms and/or hafnium atoms, providing an inorganic oxide as a binder; mixing and kneading the post-framework modified USY zeolite with the inorganic oxide binder to form a composite of post-framework modified USY zeolite and inorganic oxide binder, wherein the composite is characterized by outer surfaces and inner pore wall surfaces; impregnating one or more active metal components on outer surfaces and/or on pore inner surfaces of composite to form a metal-loaded composite of post-framework modified USY zeolite and inorganic oxide binder; forming the catalyst particles from the metal-loaded composite of post-framework modified zeolite and inorganic oxide binder into extrudates, thermally treating the extrudates; and recovering calcined catalyst particles.

In certain embodiments of the above method, the one or more active metal components impregnated on the composite is a second portion of a total active metal component content of the one or more active metal components. The post-framework modified USY zeolite is characterized by outer surfaces and pores which define inner surfaces, and the process further comprises impregnating a first portion of the total active metal component content of the one or more active metal components on outer surfaces and/or on pore inner surfaces of the post-framework modified USY zeolite to form metal-loaded post-framework modified USY zeolite. Accordingly, mixing and kneading is of the metal-loaded post-framework modified USY zeolite and inorganic oxide binder material to form a composite of metal-loaded post-framework modified USY zeolite and inorganic oxide binder material that is the composite having impregnated thereon the second portion of the total active metal component content of the one or more active metal components, and forming the catalyst particles into extrudates is from the metal-loaded composite of metal-loaded post-framework modified USY zeolite and inorganic oxide binder.

In certain embodiments of the above method, the one or more active metal components impregnated on the composite is a second portion of a total active metal component content of the one or more active metal components. The inorganic oxide binder material is characterized by outer surfaces and pores which define inner surfaces, and the process further comprises impregnating a first portion of the total active metal component content of the one or more active metal components on outer surfaces and/or on pore inner surfaces of the inorganic oxide binder material to form metal-loaded inorganic oxide binder. Accordingly, mixing and kneading is of the metal-loaded inorganic oxide binder and post-framework modified USY zeolite to form a composite of metal-loaded inorganic oxide binder and post-framework modified USY zeolite that is the composite having impregnated thereon the second portion of the total active metal component content of the one or more active metal components, and forming the catalyst particles into extrudates is from the metal-loaded composite of metal-loaded inorganic oxide binder and post-framework modified USY zeolite.

Calcined catalyst particles provided herein comprise a composite of: post-framework modified ultra-stable Y-type (USY) zeolite in which a portion of aluminum atoms constituting a zeolite framework thereof is substituted with zirconium atoms and/or titanium atoms and/or hafnium atoms; and inorganic oxide binder material. The composite is characterized by outer surfaces and pores which define inner surfaces, and said outer surfaces and/or pore inner surfaces are metal-loaded with one or more active metal components as metal-loaded composite. The metal-loaded composite is formed into extrudates and thermally treated as the calcined catalyst particles.

In certain embodiments of the above methods and compositions, said post-framework modified USY zeolite is provided in wet, dried or calcined state. In certain embodiments of the above methods and compositions, said post-framework modified USY zeolite contains from 0.1 to 5 mass % zirconium and/or titanium and/or hafnium as calculated as the oxide basis. In certain embodiments of the above methods and compositions, said inorganic oxide material is selected from the group consisting of alumina, silica, titania, silica-alumina, alumina-titania, alumina-zirconia, alumina-boria, phosphorus-alumina, silica-aluminaboria, phosphorus-alumina-boria, phosphorus-alumina-silica, silica-alumina-titania, and silica-alumina-zirconia. In certain embodiments of the above methods and compositions, said metal-loaded post-framework modified USY zeolite comprises about 0.1-99 wt % of the active metal-containing composite catalyst particles, wherein a remaining mass comprises the inorganic oxide component. In certain embodiments of the above methods and compositions, said catalyst particles are formed of post-framework modified USY zeolite, the inorganic oxide component and an additional zeolite component. In certain embodiments of the above methods and compositions, said metal-loaded post-framework modified USY zeolite comprises about 0.1-99 wt % of the catalyst particles, wherein a first remaining mass comprises the inorganic oxide component and a second remaining mass comprises the additional zeolite component. In certain embodiments of the above methods and compositions, said active metal component is selected from the group of metals consisting of platinum, palladium and rhenium, and wherein said active metal component is present in an amount from 0.01-2 wt % in terms of the mass of the active metal component relative to the mass of the catalyst particles. In certain embodiments of the above methods and compositions, said active metal component is selected from the group of metals consisting of Mo, W, Co. Ni and combinations thereof, and wherein said active metal component is present in an amount from 0.1-40 wt % in terms of the mass of the active metal component based on the mass of the catalyst particles.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments, and serve to explain principles and operations of the described and claimed aspects and embodiments.

BRIEF DESCRIPTION OF THE DRAWINGS

The invention will be described in further detail below and with reference to the attached drawings in which the same or similar elements are referred to by the same number in certain instances, and where.

DETAILED DESCRIPTION

Figure 1:
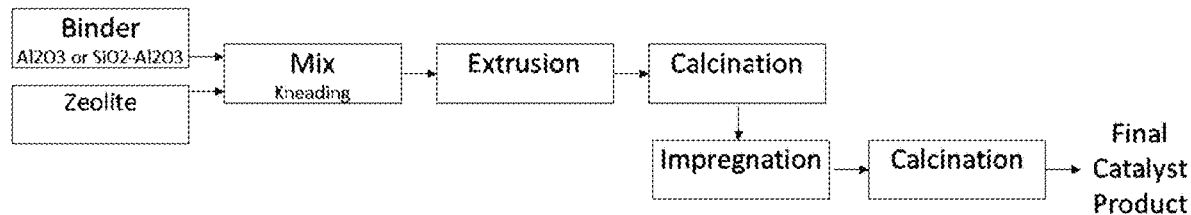
FIG. 1 is a simplified process flow diagram for producing catalyst particles according to known methods.
Figure 2:
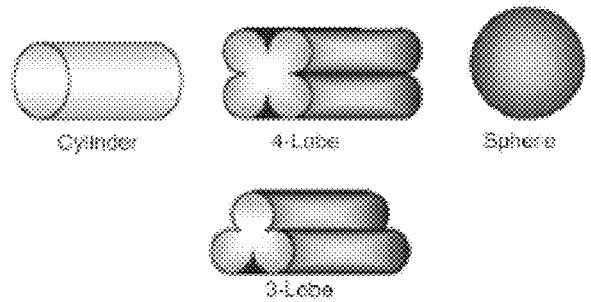
FIG. 2 illustrates shapes of catalyst particles.

The disclosure provides methods for manufacturing catalyst particles comprising one or more active metal components. The particles are a composite of (a) a granulating agent or binder material such as an inorganic oxide, and (b) an ultra-stable Y (hereafter "USY") zeolite in which some of the aluminum atoms in the framework are substituted with zirconium atoms and/or titanium atoms and/or hafnium atoms. In the present processes, the one or more active phase components are incorporated in a composite mixture of the inorganic oxide binder and the post-framework modified USY zeolite prior to forming the catalyst particles. In embodiments of the present processes the one or more active phase components are incorporated prior to extruding the resulting composite mixture having active phase components incorporated therein, and prior to forming the catalyst particles. This is in contrast to known methods in which active metal components are added to particles that are calcined and formed.

In certain embodiments, catalyst particles formed according to the invention herein are suitable for hydrocracking a heavy hydrocarbon oil obtained from crude oil, synthetic crude oil, bitumen, oil sand, shell oil or coal liquid. The above heavy hydrocarbon oil is preferably any of a) vacuum gas oil (VGO), b) deasphalted oil (DAO) obtained from a solvent deasphalting process or demetallized oil, c) light coker gas oil or heavy coker gas oil obtained from a coker process, d) cycle oil obtained from a fluid catalytic cracking (FCC) process or c) gas oil obtained from a visbreaking process.

In certain embodiments, catalyst particles formed according to the invention herein are suitable for reforming of naphtha, as disclosed in U.S. Pat. No. 10,787,618, which is incorporated herein by reference in its entirety.

In certain embodiments, catalyst particles formed according to the invention herein are suitable for hydrogenation of middle distillates and conditioning said middle distillates for steam cracking, as disclosed in US Patent Publications 2021/0246382A1, 2021/0246383A1, 2021/0246384A1 and 2021/0246389A1, which are incorporated herein by reference in their entireties; or for hydrogenation of middle distillates and conditioning said middle distillates for steam cracking and/or fluidized catalytic cracking, as disclosed in US Patent Publication 2021/0246386A1, which is incorporated herein by reference in its entirety. In certain embodiments, catalyst particles formed according to the invention herein are suitable for hydrogenation of light cycle oil and conditioning said light cycle oil for steam cracking, as disclosed in US Patent Publication 2021/0246381A1, which is incorporated herein by reference in its entirety; or for hydrogenation of light cycle oil and conditioning said light cycle oil for steam cracking and/or fluidized catalytic cracking, as disclosed in US Patent Publication 2021/0246387A1, which is incorporated herein by reference in its entirety. In certain embodiments, catalyst particles formed according to the invention herein are suitable for hydrogenation of light coker gas oil and conditioning said light coker gas oil for steam cracking, as disclosed in US Patent Publication 2021/0246385A1, which is incorporated herein by reference in its entirety; or for hydrogenation of light coker gas oil and conditioning said light coker gas oil for steam cracking and/or fluidized catalytic cracking, as disclosed in US Patent Publication 2021/0246388A1, which is incorporated herein by reference in its entirety.

Figure 3:
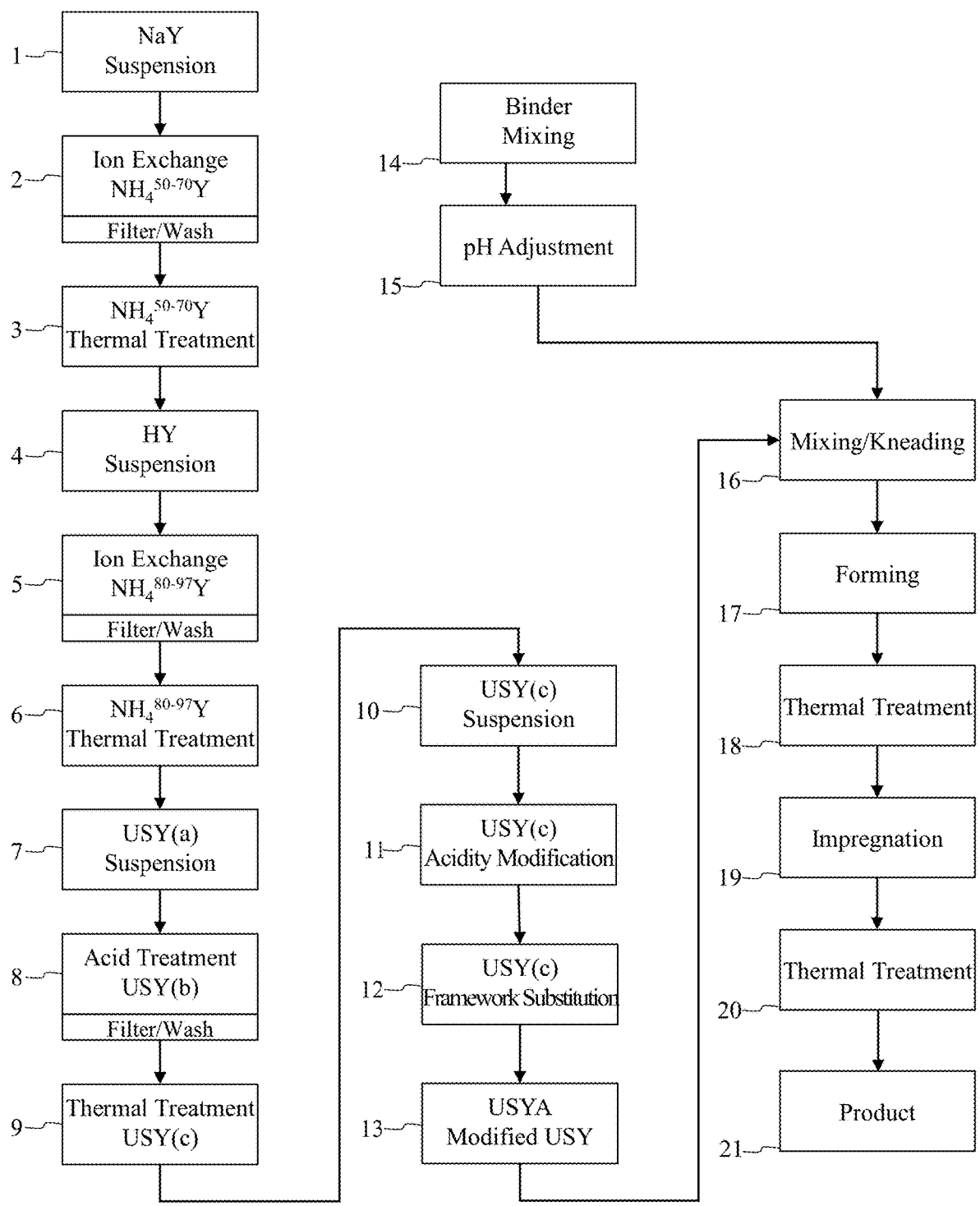
FIG. 3 is a process flow diagram showing steps for producing catalyst particles according to a known method.

For convenience of description of the processes of the present invention, FIG. 3 shows process steps for producing a post-framework modified USY zeolite, and producing catalyst particles having active metal components on a composite support including the post-framework modified USY zeolite and a binder. Certain of these process steps are similar to those disclosed in the '036 patent family.

The catalyst particles produced in accordance with the method of FIG. 3 are calcined composite support particles of the post-framework modified USY zeolite described herein and a binder, having active metal component added to the particles, and subsequently calcined.

Steps 1-9 herein provide a description of a process for the synthesis of calcined USY zeolite (denoted as USY(c) herein), which is then post-framework modified at steps 10-13. In embodiments herein of the present invention, the USY that is post-framework modified can be obtained from another source, that is, one or more of steps 1-9 can be avoided. Steps 14-15 concern preparation of an inorganic oxide binder, and steps 16-21 concern forming composite catalyst support particles (steps 16-18) and forming the final particles with an effective quantity of the active metal component (steps 19-21).

At step 1, a Y-type zeolite (Na—Y) is prepared by forming a suspension of an effective concentration of Na—Y, for instance in a liquid/solid ratio range of about 5-20, 5-15, 8-15, 5-12 or 8-12 liters (L) of water per kilogram (kg) of zeolite, and at an effective temperature, for instance in a range of about 15-95, 15-80, 20-95, 20-90, 20-80, 40-95, 40-90 or 40-80° C.

The starting material at step 1 comprising a Na—Y-type zeolite having an effective $SiO_2/Al_2O_3$ molar ratio (SAR), for example in the range of about 3-6; an effective unit cell dimension (UD), for instance of about 2.466 nanometers (nm), an effective specific surface area (SA), for example in the range of about 600-900, 600-800, 650-900 or 650-800 square meters per gram ($m^2/g$), and an effective $Na_2O$ content, for instance of about 13% by mass.

In an ion exchange step 2, a first ion-exchanged Y-type zeolite is synthesized by subjecting the Na—Y suspension from step 1 to ion exchange of sodium ions of the Na—Y with ammonium ions to prepare the first ion-exchanged Y-type zeolite (first $NH_4$—Y). In the first $NH_4$—Y, about 50-70% of Na contained in the Y-type zeolite is substituted with $NH_4$ for certain embodiments, also referred to as $NH_4^{50-70}$Y.

An embodiment of the ion exchange at step 2 includes addition to the Na—Y suspension of: an effective concentration of an ammonium source, for instance a molar ratio of ammonium to Al in the range of about 2-8; at an effective temperature in a range of about 20-95, 20-90, 20-80, 40-95, 40-90 or 40-80° C.; and for an effective residence time, for instance in a range of about 10-600, 10-180, 30-600 or 30-180 minutes. The ammonium source can be one or more of $NH_4OH$, $(NH_4)_2SO_4$, $(NH_4)_2CO_3$, or another suitable ammonium source.

The resulting solids from the ion exchange step 2 can be filtered, washed with water at an effective temperature, for instance in a range of about 20-95, 20-90, 20-80, 40-95, 40-90 or 40-80° C., and dried at an effective temperature, for example in a range of about 80-180 or 100-180° C. for an effective residence time, for instance in a range of about 30-1800, 60-1800, 30-600 or 60-600 minutes, to obtain the first ion-exchanged $NH_4$Y, $NH_4^{50-70}$Y.

Optionally, after washing the resulting solids from the ion exchange step 2, they can be washed in one or more additional cycles with an ammonium source followed by water washing, at effective temperatures, concentrations and residence times such as those at step 2. The solids matter that is washed one or more additional times is dried at effective temperatures and residence times such as those at step 2, to obtain the first ion-exchanged $NH_4$—Y, $NH_4^{50-70}$Y. In certain instances, the one or more additional cycles of the first ion exchange step are not implemented.

In a thermal treatment step 3, a hydrogen type Y-type (HY) zeolite is synthesized from the first ion-exchanged $NH_4$—Y ($NH_4^{50-70}$Y) by heating in a saturated steam atmosphere. In certain embodiments the thermal treatment at step 3 comprises calcining the first ion-exchanged $NH_4$—Y at an effective temperature and for a time effective to produce HY zeolite, for instance with a temperature in a range of about 500-800, 500-700, 600-800 or 600-700° C. (typically in the presence of steam, that is, in a saturated water vapor, or in the presence of air or oxygen) and for a time range of about 10-600, 10-180, 30-600 or 30-180 minutes. In certain embodiments, if there remains a substantial amount of Na in the HY zeolite, ion exchange may be repeated one or more times as in step 2. The HY zeolite is converted to USY following additional ammonium ion exchange and steaming treatment discussed below at steps 4-6.

At steps 4-6, the HY zeolite is treated to synthesize a second ion-exchanged NH—Y zeolite having 80-97% of Na contained in the Na—Y exchanged with $NH_4$, also referred to as $NH_4^{80-97}$Y. For instance as depicted, at step 4 a suspension is prepared containing an effective concentration of HY zeolite, for instance in a solid/liquid mass ratio range of about 5-20, 5-15, 8-15, 5-12 or 8-12 L/kg (water/zeolite), and at an effective temperature, for instance in a range of about 15-95, 15-80, 20-95, 20-90, 20-80, 40-95, 40-90 or 40-80° C.

In an ion exchange step 5, a second ion-exchanged Y-type zeolite is synthesized by subjecting the $NH_4$—Y suspension from step 4 to ion exchange of 80-97 or 90-97% sodium ions of the Na—Y with ammonium ions to prepare a second ammonium-exchanged Y-type zeolite (second $NH_4$—Y). $NH_4^{80-97}$Y. An embodiment of the ion exchange at step 5 includes addition and stirring of an effective concentration of an ammonium, for instance a molar ratio of ammonium to Al in the range of about 2-8; at an effective temperature in a range of about 20-95, 20-90, 20-80, 40-95, 40-90 or 40-80° C.; and for an effective residence time, for instance in a range of about 10-600, 10-180, 30-600 or 30-180 minutes. The ammonium source can be one or more of $NH_4OH$, $(NH_4)_2SO_4$, $(NH_4)_2CO_3$, or another suitable ammonium source.

The resulting solids from the ion exchange step 5 can be filtered, washed with water at an effective temperature, for instance in a range of about 20-95, 20-90, 20-80, 40-95, 40-90 or 40-80° C., and dried at an effective temperature, for example in a range of about 80-180 or 100-180° C., for an effective residence time, for instance in a range of about 30-1800, 60-1800, 30-600 or 60-600 minutes, to obtain the second ion-exchanged $NH_4$-Y, $NH_4^{80-97}$-Y.

Optionally, after washing the resulting solids from the ion exchange step 5, they can be washed in one or more additional cycles with an ammonium source followed by water washing, at effective temperatures, concentrations and residence times such as those at step 5. The solids washed one or more additional times are dried at effective temperatures and residence times such as those at step 5, to obtain the second ion-exchanged $NH_4$—Y, $NH_4^{80-97}$Y. In certain instances, the one or more additional cycles of the second ion exchange step are not implemented.

In a thermal treatment step 6, a first ultra-stable Y-type zeolite, referred to herein as USY(a), is synthesized by calcining the $NH_4^{80-97}$Y. Thermal treatment at step 6 comprises calcining the second ion-exchanged $NH_4$—Y at an effective temperature, for instance in a range of about 500-800, 500-700, 600-800 or 600-700° C. (typically in the presence of steam, that is, in a saturated water vapor, or in the presence of air or oxygen) and for a time range of about 10-600, 10-180, 30-60) or 30-180 minutes, to recover USY (a). In certain embodiments the thermal treatment of the $NH_4^{80-97}Y$ is by steaming.

The USY(a) from step 6 is USY zeolite that possesses a SAR that is approximately equivalent to that of the starting Na—Y. The steps 1-6 should generally not significantly change the SAR value, because these steps to not entail acid treatment to target ejection of aluminum atoms from the zeolite framework. For example, the USY(a) thus obtained at step 6 can have a SAR of about 3-6.

At steps 7-9, the USY(a) zeolite is treated to synthesize calcined USY zeolite having an increased SAR, which is the starting material for subsequent post-framework modification. At step 7, an aqueous suspension is prepared containing an effective concentration of the USY(a), for instance in a solid/liquid mass ratio range of about 5-20, 5-15, 8-15, 5-12 or 8-12 L/kg (water/zeolite), and at an effective temperature, for instance in a range of about 15-95, 15-80, 20-95, 20-90, 20-80, 40-95, 40-90 or 40-80° C.

In an acid treatment step 8, an effective quantity of an inorganic acid or an organic acid is dispersed in the suspension so that a pH of the suspension is maintained in a strongly acidic range to synthesize a second ultra-stable Y-type zeolite, referred to herein as USY(b), having an increased SAR. Extraskeletal aluminum (aluminum atoms which do not form part of the zeolite framework) are removed from the USY(a) in order to obtain the USY(b) zeolite. This is carried out by acid treatment.

The inorganic acid use can generally be sulfuric acid, nitric acid, hydrochloric acid and the like. In certain embodiments the selected inorganic acid is sulfuric acid or hydrochloric acid. Further, carboxylic acids can suitably be used as the organic acid described above. The amount of the inorganic acid or the organic acid added is the amount suitable to control the pH of the suspension in a strongly acidic range, for instance in a range of about 0.7-2.5, 0.7-2.0, 1.0-2.5 or 1.0-2.0. The amount may be, for example, a 0.5-4.0-fold, 0.5-3.5-fold, 0.7-4.0-fold or 0.7-3.5-0.5-fold molar increase based on an amount of $Al_2O_3$ in the USY(a). The acidic suspension is maintained at an effective temperature, for instance 15-95, 15-80, 20-95, 20-90, 20-80, 40-95, 40-90 or 40-80° and maintained for an effective residence time, for instance in a range of about 10-600, 10-180, 30-600 or 30-180 minutes. Acid treatment at step 8 increases the SAR of the Y-type zeolite, for example, from a range of about 3-6 to a range of about 30-100, 40-100, 30-80 or 40-80.

The resulting solids from the acid treatment step 8 can be filtered, washed with water at an effective temperature, for instance in a range of about 15-95, 15-80, 20-95, 20-90, 20-80, 40-95, 40-90 or 40-80° C., and dried at an effective temperature, for example in a range of about 80-180 or 100-180° C., for an effective residence time, for instance in a range of about 30-1800, 60-1800, 30-600 or 60-600 minutes, to recover USY(b).

Optionally, after washing the resulting solids from the acid treatment step 8, they can be treated in one or more additional cycles with an inorganic acid or organic acid followed by water washing, at effective temperatures, concentrations and residence times such as those at step 8. The solids which are acid-treated one or more additional times are dried at effective temperatures and residence times such as those at step 8, to recover USY(b). In certain instances, the one or more additional cycles of the first acid treatment step are not implemented.

In a thermal treatment step 9, the USY(b) zeolite is subjected to thermal treatment to prepare a third ultra-stable Y-type zeolite, USY(c). In certain embodiments the thermal treatment at step 9 comprises calcining the second USY zeolite (USY(b)) at effective temperatures, for example in a range of about 500-700, 550-700, 500-650 or 550-650° C. (typically in the presence of air or oxygen, or in the presence of steam), and for a time range of about 10-600, 10-180, 30-600 or 30-180 minutes, to recover USY(c). If the calcining temperature is lower than about 500° C., the framework substitution amount of zirconium atoms and/or titanium atoms and/or hafnium atoms tends to be reduced; at calcining temperatures that exceed about 700° C., the specific surface area of the ultra-stable Y-type zeolite can be reduced, and a framework substitution amount of zirconium atoms and/or titanium atoms and/or hafnium atoms is thus reduced.

At steps 10-13 framework substitution is carried out to produce the post-framework modified USY zeolite having a portion of the aluminum atoms within the USY zeolite framework are substituted with zirconium and/or titanium and/or hafnium atoms. In certain embodiments, a post-framework modified USY zeolite material is produced by firing a USY zeolite having the properties described herein at about 500-700° C. A suspension is formed containing the fired USY zeolite, the suspension having a liquid/solid mass ratio of about 5-15. An inorganic acid or an organic acid is added so that a pH of the suspension is about <2.0. Subsequently a solution containing a zirconium compound and/or a titanium compound and/or a hafnium compound is mixed. The solution is neutralized with, for example, an aqueous ammonia, so that the pH of the mixed solution is about 7-7.5.

Suitable zirconium compounds described above include one or more of zirconium sulfate, zirconium nitrate, zirconium chloride and the like. In certain embodiments zirconium sulfate and/or zirconium nitrate are selected. The quantity of the zirconium compound added is generally about 0.1-5.0, 0.1-4.0, 0.1-3.0, 0.2-5.0, 0.2-4.0, 0.2-3.0, 0.3-5.0, 0.3-4.0 or 0.3-3.0 wt %, as calculated on their oxide basis (that is, zirconium oxide) and as measured relative to the mass of the post-framework modified USY zeolite component. Addition of the zirconium compound in an amount of less than about 0.1 wt % fails to improve solid acid characteristics of the zeolite. The addition of the zirconium compound in an amount exceeding 5 wt % tends to cause clogging of pores of the zeolite. An aqueous solution of a zirconium compound prepared by dissolving the zirconium compound in water can be used as the zirconium compound.

Suitable titanium compounds include one or more of titanium sulfate, titanium acetate, titanium chloride, titanium nitrate, and titanium lactate. In certain embodiments titanium sulfate and/or titanium acetate are selected. The quantity of the titanium compound added is generally about 0.1-5.0, 0.1-4.0, 0.1-3.0, 0.2-5.0, 0.2-4.0, 0.2-3.0, 0.3-5.0, 0.3-4.0 or 0.3-3.0 wt %, as calculated on their oxide basis (that is, titanium oxide) and as measured relative to the mass of the post-framework modified USY zeolite component. Addition of the titanium compound in an amount of less than about 0.1 wt % fails to improve solid acid characteristics of the zeolite. The addition of the titanium compound in an amount exceeding 5 wt % tends to cause clogging of pores of the zeolite. An aqueous solution of a titanium compound prepared by dissolving the titanium compound in water can be used as the titanium compound.

Suitable hafnium compounds described above include one or more of hafnium chloride, hafnium nitrate, hafnium fluoride, hafnium bromide, hafnium oxalate and the like. In certain embodiments hafnium chloride and/or hafnium nitrate are selected. The quantity of the hafnium compound added is generally about 0.1-5.0, 0.1-4.0, 0.1-3.0, 0.2-5.0, 0.2-4.0, 0.2-3.0, 0.3-5.0, 0.3-4.0 or 0.3-3.0 wt %, as calculated on their oxide basis (that is, hafnium oxide) and as measured relative to the mass of the post-framework modified USY zeolite component. Addition of the hafnium compound in an amount of less than about 0.1 wt % fails to improve solid acid characteristics of the zeolite. The addition of the hafnium compound in an amount exceeding 5 wt % tends to cause clogging of pores of the zeolite. An aqueous solution of a hafnium compound prepared by dissolving the hafnium compound in water can be used as the hafnium compound.

A pH of the above suspension is controlled to about <2.0 to prevent a precipitate from being generated during mixing of the aqueous solution of the zirconium compound and/or the hafnium compound and/or the titanium compound with a suspension of the ultra-stable Y-type zeolite described above.

Mixing of the aqueous solution of the zirconium compound and/or the hafnium compound and/or the titanium compound with a suspension of the ultra-stable Y-type zeolite is, in certain embodiments, is conducted by gradually adding said aqueous solution to the suspension. After completion of addition of the aqueous solution described above to the suspension, the solution can be mixed by stirring at, for example, room temperature (about 25-35° C.) for about 3-5 hours. Further, after completion of the above-described mixing, the admixed solution is neutralized by adding an alkali compound such as aqueous ammonia and/or the like, so that a pH thereof is controlled to about 7.0-7.5, whereby the post-framework modified USY zeolite described herein is be obtained.

In this regard: when only the zirconium compound (or an aqueous solution thereof) is used as the compound (or an aqueous solution thereof) and added to the suspension described above, the post-framework modified USY zeolite (Zr—USY) in which zirconium atoms are substituted for a part of aluminum atoms forming the framework of the ultra-stable Y-type zeolite is formed; when only the titanium compound (or an aqueous solution thereof) is used, the post-framework modified USY zeolite (Ti—USY) in which titanium atoms are substituted for a part of aluminum atoms forming the framework of the ultra-stable Y-type zeolite is formed; when only the hafnium compound (or an aqueous solution thereof) is used, the post-framework modified USY zeolite (Hf—USY) in which hafnium atoms are substituted for a part of aluminum atoms forming the framework of the ultra-stable Y-type zeolite is formed; when the zirconium compound and the titanium compound (or aqueous solutions thereof) are used, the post-framework modified USY zeolite in the catalyst (Zr—Ti—USY) in which zirconium atoms and titanium atoms are substituted for a part of aluminum atoms forming the framework of the ultra-stable Y-type zeolite is formed; when the zirconium compound and the hafnium compound (or aqueous solutions thereof) are used, the post-framework modified USY zeolite in the catalyst (Zr—Hf—USY) in which zirconium atoms and hafnium atoms are substituted for a part of aluminum atoms forming the framework of the ultra-stable Y-type zeolite is formed; when the hafnium compound and the titanium compound (or aqueous solutions thereof) are used, the post-framework modified USY zeolite in the catalyst (Hf—Ti—USY) in which hafnium atoms and titanium atoms are substituted for a part of aluminum atoms forming the framework of the ultra-stable Y-type zeolite is formed; and when the zirconium compound, the titanium compound and the hafnium compound (or aqueous solutions thereof) are used, the post-framework modified USY zeolite in the catalyst (Zr—Ti—Hf—USY) in which zirconium atoms, titanium atoms and hafnium atoms are substituted for a part of aluminum atoms forming the framework of the ultra-stable Y-type zeolite is formed.

The resulting framework-substituted zeolite can be filtered, if desired, washed with water, and dried at about 80-180° C.; the mixture may be quasi-equilibrated with steam, for instance, at a temperature of from about 600-800° C. for about 10-20 hours.

For instance, at step 10, the calcined USY(c) zeolite from step 9 is prepared for acid treatment by forming a suspension of an effective concentration USY(c), for instance in a liquid/solid mass ratio range of about 5:1-15:1, 5:1-12:1, 8:1-15:1 or 8:1-12:1, by dispersion in water at an effective temperature, for example, in the range of about 15-95, 15-80, 20-95, 20-90, 20-80, 40-95, 40-90 or 40-80° C.

In an acid treatment step 11, an effective quantity of an inorganic acid or an organic acid is dispersed in the suspension so that a pH of the suspension is maintained in a strongly acidic range to prepare the zeolite for metal insertion in the framework, step 12. In certain embodiments, this can be stepwise as in the '036 patent family. In additional embodiments, for example as disclosed in commonly owned US20210077985A1 which is incorporated by reference herein in its entirety, acid treatment to prepare the zeolite for metal insertion in the framework can occur together with the metal insertion.

The inorganic acid use can generally be sulfuric acid, nitric acid, hydrochloric acid and the like. In certain embodiments the selected inorganic acid is sulfuric acid or hydrochloric acid. Further, carboxylic acids can suitably be used as the organic acid described above. The amount of the inorganic acid or the organic acid added is the amount suitable to control the pH of the suspension in a strongly acidic range, for instance in a range of about 0.7-2.5, 0.7-2.0, 1.0-2.5 or 1.0-2.0. The acidic suspension is maintained at an effective temperature, for instance in the range of about 15-80, 15-60, 15-35, 15-30 or 20-60° C. and maintained for an effective residence time, and maintained for an effective residence time, for instance in a range of about 10-600, 10-180, 30-600 or 30-180 minutes.

In a metal insertion step 12, the framework substitution is carried out. The acid-modified USY(c) zeolite suspension is subjected to metals treatment to substitute some of the aluminum atoms forming the framework of the ultra-stable Y-type zeolite. In certain embodiments, this is carried out by adding to the acidity modified USY(c) a solution containing transition metal compounds. In certain embodiments the transition metal compounds comprise a zirconium compound and/or a titanium compound and/or a hafnium compound. The solution is maintained at an effective temperature, for instance 15-80, 15-60, 15-35, 15-30, 20-60, 15-35 or 15-30° C. and for an effective residence time, for instance in a range of about 10-600, 10-180, 30-600 or 30-180 minutes. The suspension from step 12 can be neutralized with, for example, an aqueous ammonia, to a pH in the range of about 7.0-7.5.

The resulting solids from the metal insertion step 12 can be filtered, washed with water at an effective temperature, for instance in a range of about 15-95, 15-80, 20-95, 20-90, 20-80, 40-95, 40-90 or 40-80° C., and dried at an effective temperature, for example in a range of about 80-180 or 100-180° C. for an effective residence time, for instance in a range of about 30-1800, 60-1800, 30-600 or 60-600 minutes, and the post-framework modified USY zeolite (USYA) is recovered at step 13.

Ultra-stable Y-type zeolite is used as the raw materials for preparing the post-framework modified USY zeolite, referred to above as USY(c). As noted above, one or more of the steps 1-9 can be used to prepare the USY introduced at step 10, or otherwise obtained. Said USY introduced at step 10 generally has properties of known USY zeolites, which can be synthesized or modified (as in one or more of the steps 1-9 or alternative methodologies), or sourced, so as to provide a USY zeolite having a SAR in the range of about 30-100, 40-100, 30-80 or 40-80 for effective metal insertion.

The known USY-type zeolite refers to zeolite having a unit cell dimension (UD) generally in the range of about 2.425-2.450 or 2.430-2.450 nm; a specific surface area generally in the range of about 600-900, 600-800, 650-900 or 650-800 m$^2$/g; and a pore volume of about 0.3-0.75, 0.4-0.75, 0.3-0.6 or 0.4-0.6 ml/g. Known USY-type zeolites also generally possess a SA R in the range of about 5-100, 10-100, 20-100, 5-80, 10-80, 20-80, 25-100 or 25-80; as noted herein, this SAR can be selected or modified to provide an effective USY for metal insertion.

For example, suitable zeolites are FAU framework (zeolite Y) having its micropore pore formed by a 12-membered ring when viewed along the [111] direction is 7.4×7.4 Å. The UD, also referred to as a crystal lattice constant, can be measured by reference to ASTM method D3942. Standard Test Method for Determination of the Unit Cell Dimension of a Faujasite-Type Zeolite. The specific surface area is a value determined by the BET (Brunauer-Emmett-Teller) method using nitrogen adsorption. The ultra-stable Y-type zeolite may be prepared by any method known in the art. This ultra-stable Y-type zeolite is subjected to post-framework modification as described herein to form post-framework modified USY zeolite that is used to produce composite catalyst particles.

The post-framework modified USY zeolite incorporates one or more of zirconium, titanium, and hafnium into its framework. Effective concentrations of the Zr. Ti, and/or Hf include about 0.1-5.0, 0.1-4.0, 0.1-3.0, 0.2-5.0, 0.2-4.0, 0.2-3.0, 0.3-5.0, 0.3-4.0 or 0.3-3.0 wt %, as calculated on their oxide basis (that is, $ZrO_2$, $TiO_2$ and/or $HfO_2$) and as measured relative to the mass of the post-framework modified USY zeolite. In certain embodiments, the amounts of individual materials supplying Zr, Ti, and/or Hf can be less than 0.1, 0.2 or 0.3 wt %, but when combined, the total is at least 0.1, 0.2 or 0.3 wt %. It is appreciated by a person of skill in the art, that when the framework-substituted zeolite in the catalyst contains the zirconium atoms and the titanium atoms and/or the hafnium atoms described above, a mass ratio (in terms of oxides) of the zirconium atoms to the titanium atoms and/or the hafnium atoms is not specifically be restricted, and any ratio of zirconium or titanium or hafnium that is effective for the intended use of the catalyst particles can be used, for example, for hydrocracking of heavy hydrocarbon oil.

In certain embodiments the post-framework modified USY zeolite is:

a framework-substituted zeolite in which a part of aluminum atoms forming a zeolite framework is substituted only with zirconium atoms, and is referred to as a "zirconium-substituted zeolite" or "Zr—USY";

a framework-substituted zeolite in which a part of aluminum atoms forming a zeolite framework is substituted only with titanium atoms, and is referred to as a "titanium-substituted zeolite" or "Ti—USY";

a framework-substituted zeolite in which a part of aluminum atoms forming a zeolite framework is substituted only with hafnium atoms, and is referred to as a "hafnium-substituted zeolite" or "Hf—USY";

a framework-substituted zeolite in which a part of aluminum atoms forming a zeolite framework is substituted only with zirconium atoms and titanium atoms, and is referred to as a "zirconium-titanium-substituted zeolite" or "Zr—Ti—USY");

a framework-substituted zeolite in which a part of aluminum atoms forming a zeolite framework is substituted only with hafnium atoms and titanium atoms, and is referred to as a "hafnium-titanium-substituted zeolite" or "Hf—Ti—USY");

a framework-substituted zeolite in which a part of aluminum atoms forming a zeolite framework is substituted only with zirconium atoms and hafnium atoms, and is referred to as a "zirconium-hafnium-substituted zeolite" or "Zr—Hf—USY"); and a framework-substituted zeolite in which a part of aluminum atoms forming a zeolite framework is substituted only with zirconium atoms, titanium and hafnium atoms, and is referred to as a "zirconium-titanium-hafnium substituted zeolite" or "Zr—Ti—Hf—USY."

The presence of the zirconium atoms and/or titanium and/or hafnium atoms which are substituted for the aluminum atoms in the post-framework modified USY zeolite serve as constituents of the framework of the USY zeolite. Substitution can be verified by, for example, X-ray fluorescence, high frequency plasma emission spectrometry, atomic absorption spectrometry, ultraviolet-visible-near-infrared spectrophotometry (UV-Vis-NIR), Fourier transform infrared spectroscopy (FT-IR), and/or nuclear magnetic resonance spectrometry (NMR).

The next steps in the process for producing catalyst particles having active metal components on a composite support including the post-framework modified USY zeolite and a binder, steps 14 and 15, comprise forming an inorganic oxide as a binder or granulating agent, which is subsequently combining with the post-framework modified USY zeolite and extruded, steps 16 and 17. At step 14, a solution is prepared that will precipitate into the one or more inorganic oxides used as the binder or granulating agent, hereinafter the inorganic oxide component. For example, a suitable binder can be prepared from a gel of alumina or another inorganic oxide as is known in the art. In certain embodiments, solid inorganic oxides can be used directly as the binder materials.

Alternatively, a commercially available inorganic oxide component can be provided, as is known to those skilled in the art, and prepared for mixing with the post-framework modified USY zeolite, for example by kneading.

As the inorganic oxide, a porous inorganic oxide used in hydrocracking or other catalyst compositions in the related art can be used. Examples thereof include alumina, silica, titania, silica-alumina, alumina-titania, alumina-zirconia, alumina-boria, phosphorus-alumina, silica-alumina-boria, phosphorus-alumina-boria, phosphorus-alumina-silica, silica-alumina-titania, and silica-alumina-zirconia.

The post-framework modified USY zeolite and the inorganic binder are combined to form the catalyst support material with known processes for forming catalysts, for example, by mixing and kneading the components (step 16), then forming them into the desired shapes by coextruding or otherwise forming composite support particles (step 17). The composite support particles are calcined (step 18), and the active metal component is impregnated in the calcined composite support particles (step 19). The so-formed catalyst particles are then calcined again (step 20) and the final product, the catalyst particles having active metal components on a composite support, is recovered. In certain embodiments the post-framework modified USY zeolite material in the final particles services as an active catalytic material in addition to the impregnated active metal component of the catalyst particle.

The composite support material is formed of the post-framework modified USY zeolite material, for example from step 13 herein, one or more inorganic oxide components (for example from step 15 herein), and optionally one or more other zeolitic materials. The composite support material generally has a surface area in the range of about 150-500, 150-450, 200-500, 200-450 or 300-450 m$^2$/g, and a pore volume in the range of about 0.4-0.8, 0.4-0.75, 0.4-0.65, 0.45-0.8, 0.45-0.75 or 0.45-0.65 ml/g. The content of the post-framework modified USY zeolite component, the inorganic oxide component and the active metal component are appropriately determined according to the object. For example, the post-framework modified USY zeolite content of the catalyst particles formed with the composite support material can be in the range of about 0.1-99, 0.1-90, 0.1-80, 0.1-70, 2-99, 2-90, 2-80, 2-70, 20-100, 20-90, 20-80 or 20-70 wt %, with the remaining content being the inorganic oxide and the active metal component, and in certain embodiments optionally one or more other zeolitic materials.

In the mixing/kneading step 16, post-framework modified USY zeolite, for instance recovered from step 13 or otherwise provided, and the inorganic binder for instance recovered from step 15 or otherwise provided, are mixed together. The mixing is at effective ratios as noted above, and at a suitable temperature, for example, in the range of about 15-80, 15-60, 15-35, 15-30 or 20-60° C. The mixture is kneaded/mulled with an effective amount of water, for instance, at a liquid/solid mass ratio range of about 30-80, for an effective kneading/mulling time, for instance in a range of about 10-180 minutes. Therefore, the kneading/mulling of the wet solid materials forms a dough that is subsequently formed and dried. The kneaded/mulled product can be subjected to thermal treatment in order to obtain a more intimate contact between components and better homogeneity by thermal diffusion and solid-state reactions.

The kneaded/mulled material thus obtained is extruded, forming step 17, through a die with an effective cross-sectional shape and dimension, and at a suitable temperature, for example, in the range of about 15-80, 15-60, 15-35, 15-30 or 20-60° C. Effective cross-sectional shapes include, for instance, cylindrical, trilobe, twisted trilobe, or quadrilobe. Effective cross-sectional dimensions include, for instance, a diameter or effective diameter in the range of about 0.8-3 or 0.8-2.5 millimeters. The resulting extrudates are dried at an effective temperature, for example in a range of about 80-180 or 100-180° C., for an effective residence time, for instance in a range of about 30-1800, 60-1800, 30-600 or 60-600 minutes, to recover dried composite extrudates. Optionally, the separate drying step can be avoided, whereby the composite extrudates are passed to a thermal treatment step 18 for calcination.

In the thermal treatment step 18, the composite extrudates (optionally dried) are subjected to thermal treatment to prepare calcined composite particles. In certain embodiments the thermal treatment at step 18 comprises calcining the composite extrudates (optionally dried) at effective temperatures (typically in the presence of air or oxygen, or in the presence of steam), for example in a range of about 400-800, 400-700, 400-650, 500-800, 500-700, 500-650, 550-800, 550-700, 550-650, 600-800 or 600-700° C., and for a time range of about 10-600, 10-180, 30-600 or 30-180 minutes, to recover calcined composite particles.

The final product, calcined composite catalyst particles have impregnated therein an active metal component, such as a hydrogenative metal. The active metal component can include one or more metals or metal compounds (oxides or sulfides) known in the art of hydrocracking, including those selected from the Periodic Table of the Elements IUPAC Groups 6, 7, 8, 9 and 10. In certain embodiments the active metal components include those effective as hydrocracking catalysts such as one or more of Mo. W, Co or Ni (oxides or sulfides). In certain embodiments, active metal components include those effective as hydrogenation and/or reforming catalysts (typically in sulfur-free environments) such as one or more noble metals such as Pt, Pd, Rh, Re, Ir, or a combination of such noble metals. The metal component may be contained in catalyst in effective concentrations. For example, total active metal content in hydrocracking catalysts can be present in an amount as is known in the related art, for example about 0.01 to 40% by mass in terms of metal, oxide or sulfide. In the case of non-noble metals, including Mo, W, Co, Ni or combinations thereof, an effective total active metal content can be about 0.1 to 40%, or 3 to 40%, by by mass in terms of oxide or sulfide based on a mass of the catalyst. In the case of noble metals, typically in sulfur-free environments for hydrogenation and/or reforming, an effective total active metal content can be in about 0.01 to 2% by mass in terms of metal.

At the active metal component impregnation step 19 in the embodiment of FIG. 3, the active metal component is impregnated. Several methods can be used to add the active metal component(s) to the support, including but not limited to immersion, incipient wetness, and evaporative. In the most commonly used method, a calcined support is immersed in an excess of an aqueous solution containing active metals or metal compounds. The solution fills the pores and is also adsorbed on the support surface, and excess solution is removed. In another method, impregnation is carried out using incipient wetness by tumbling or spraying the activated support with a volume of solution having a concentration of metal compound tailored to achieve the targeted metal level. In another method, evaporative impregnation, the support is saturated with water or with acid solution and immersed into the aqueous solution containing the metal compound. That compound subsequently diffuses into the pores of the support through the aqueous phase. The metal-loaded support is then dried and calcined, forming metal oxides.

In certain embodiments, the active metal component impregnation step 19 comprises immersing the calcined composite support particles, formed of the post-framework modified USY zeolite and a binder, in an aqueous solution containing active metal components. The quantity and concentration of the aqueous solution containing active metal components is dependent on the desired quantity of the active metal components to be loaded on the composite support particles. In certain embodiments of the above methods, the volume of the active metal solution is equal to or slightly less than the pore volume of the support. The solution is maintained at an effective temperature, for instance about 40-100, 40-99, 60-100, 60-99, 60-97, 70-99, 70-97, 80-99, 80-97 or 90-99° (C and for an effective residence time, for instance in a range of about 40-120, 40-600, 40-360, 60-1200, 60-600, 60-360, 120-1200, 120-60), 120-360, 180-1200, 180-600, 180-360, or 240-360 minutes.

The resulting solids can be filtered and dried at an effective temperature, for example in a range of about 80-180 or 100-180° C. for an effective residence time, for instance in a range of about 30-1800, 60-1800, 30-600 or 60-600 minutes, to recover composite support particles, formed of the post-framework modified USY zeolite and a binder, having the active metal loaded on the composite material. Optionally, the separate drying step can be avoided, whereby the composite material with active metal is passed to a thermal treatment step 20 for calcination.

In the thermal treatment step 20, the loaded composite material is subjected to thermal treatment to prepare calcined composite particles with active metal on the composite material. In certain embodiments the thermal treatment at step 20 comprises calcining at effective temperatures, for example in a range of about 400-800, 500-800, 500-700, 500-650, 550-800, 550-700, 550-650, 600-800 or 600-700° C., and for a time range of about 10-600, 10-180, 30-600 or 30-180 minutes, to recover the calcined composite particles with active metal on the composite material. In certain embodiments, calcining occurs in the presence of air.

At step 21, the final catalyst product is recovered. In embodiments in which the catalyst is a hydrocracking catalyst, a hydrogenation catalyst or a reforming catalyst, the composite support material having active metals loaded therein generally has a surface area in the range of about 150-500, 150-450, 200-500, 200-450 or 300-450 m²/g, and a pore volume in the range of about 0.4-1.0, 0.4-0.8, 0.4-0.75, 0.4-0.65, 0.45-1.0, 0.45-0.8, 0.45-0.75 or 0.45-0.65 ml/g.

Figure 4:
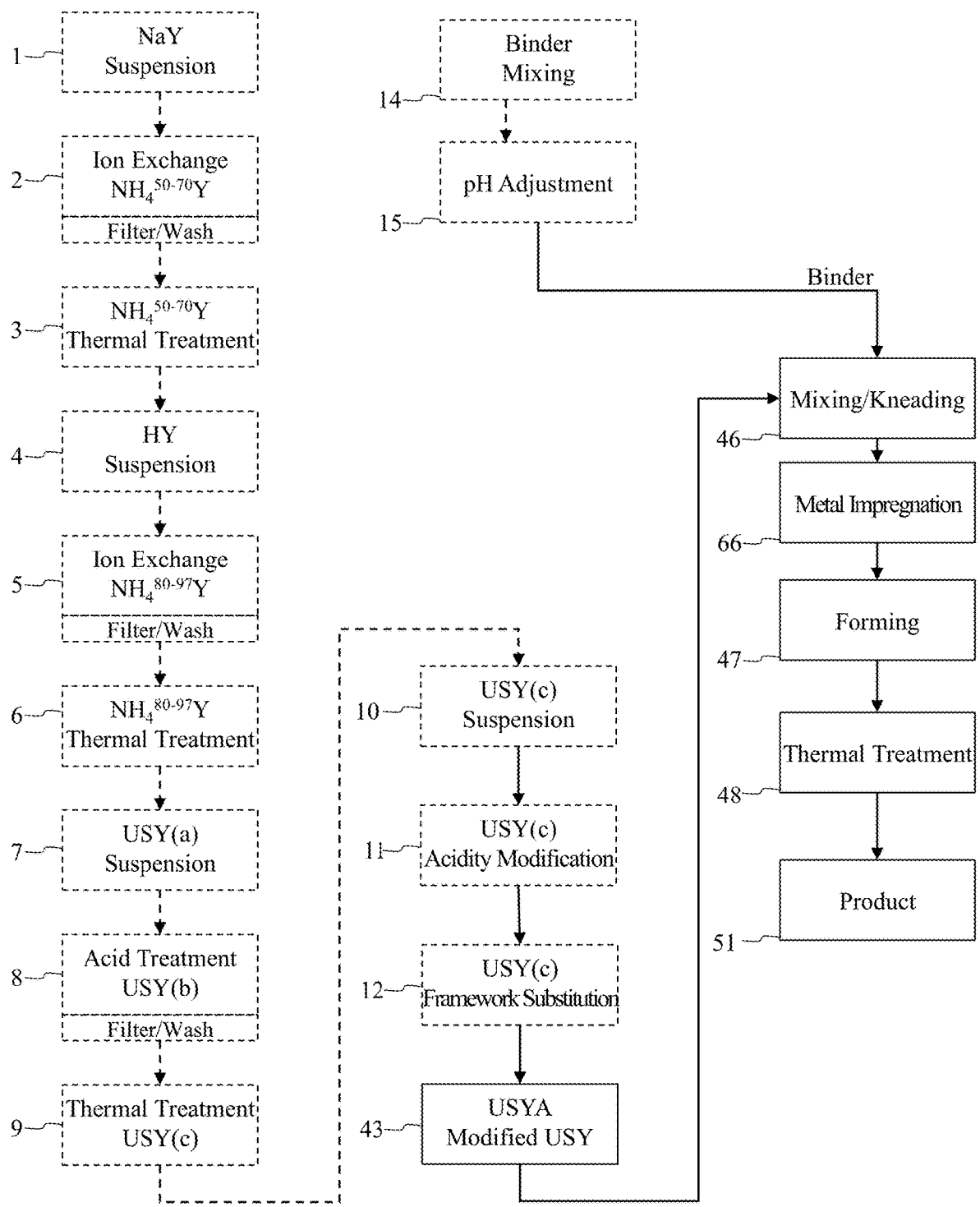
FIG. 4 is a process flow diagram showing steps for producing catalyst particles according to embodiments herein in which active metals are impregnated in a composite of framework substituted USY zeolite material and binder.
Figure 5:
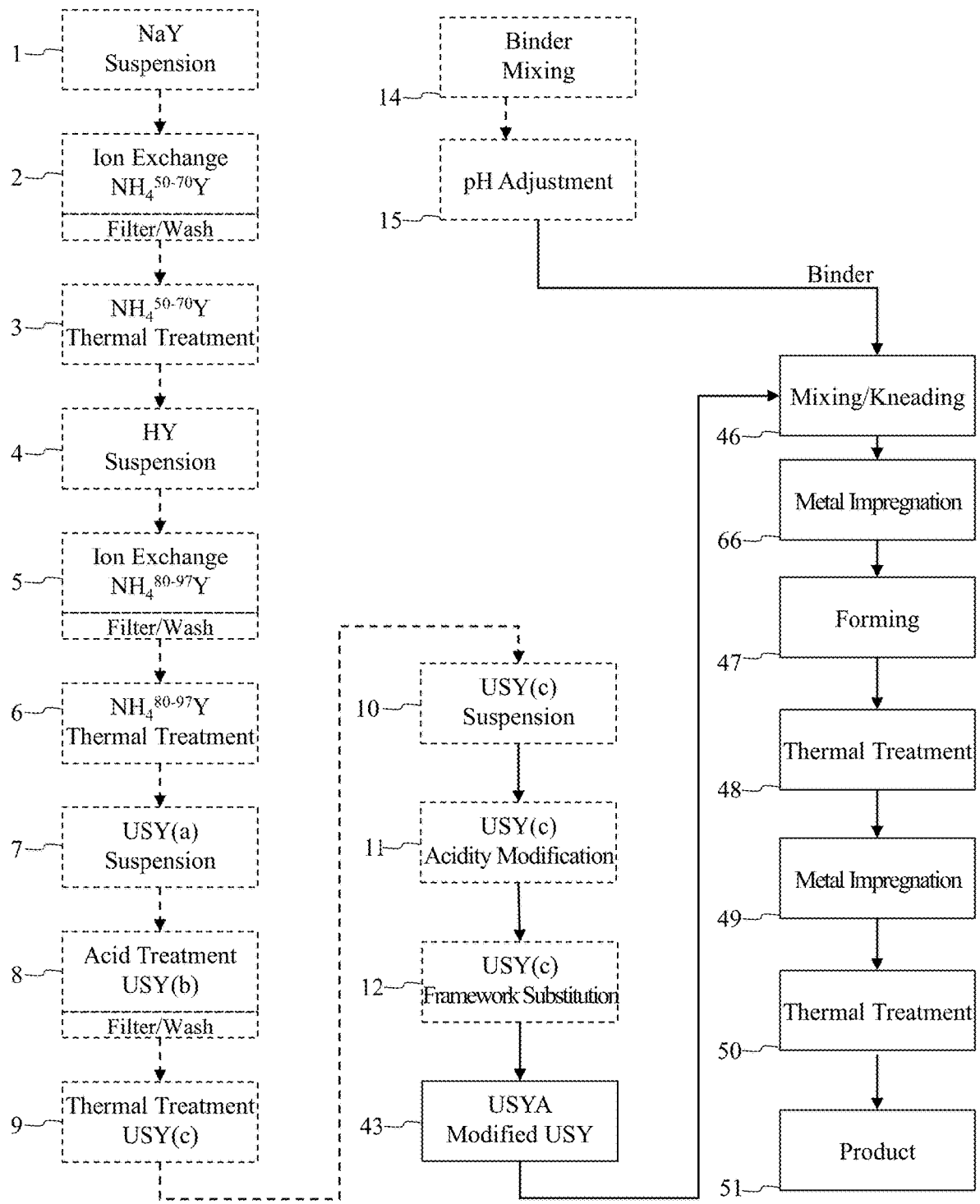
FIG. 5 is a process flow diagram showing steps for producing catalyst particles according to embodiments herein in which active metals are impregnated in a composite of framework substituted USY zeolite material and binder, and in the in extrudate of the metal-loaded composite.
Figure 6:
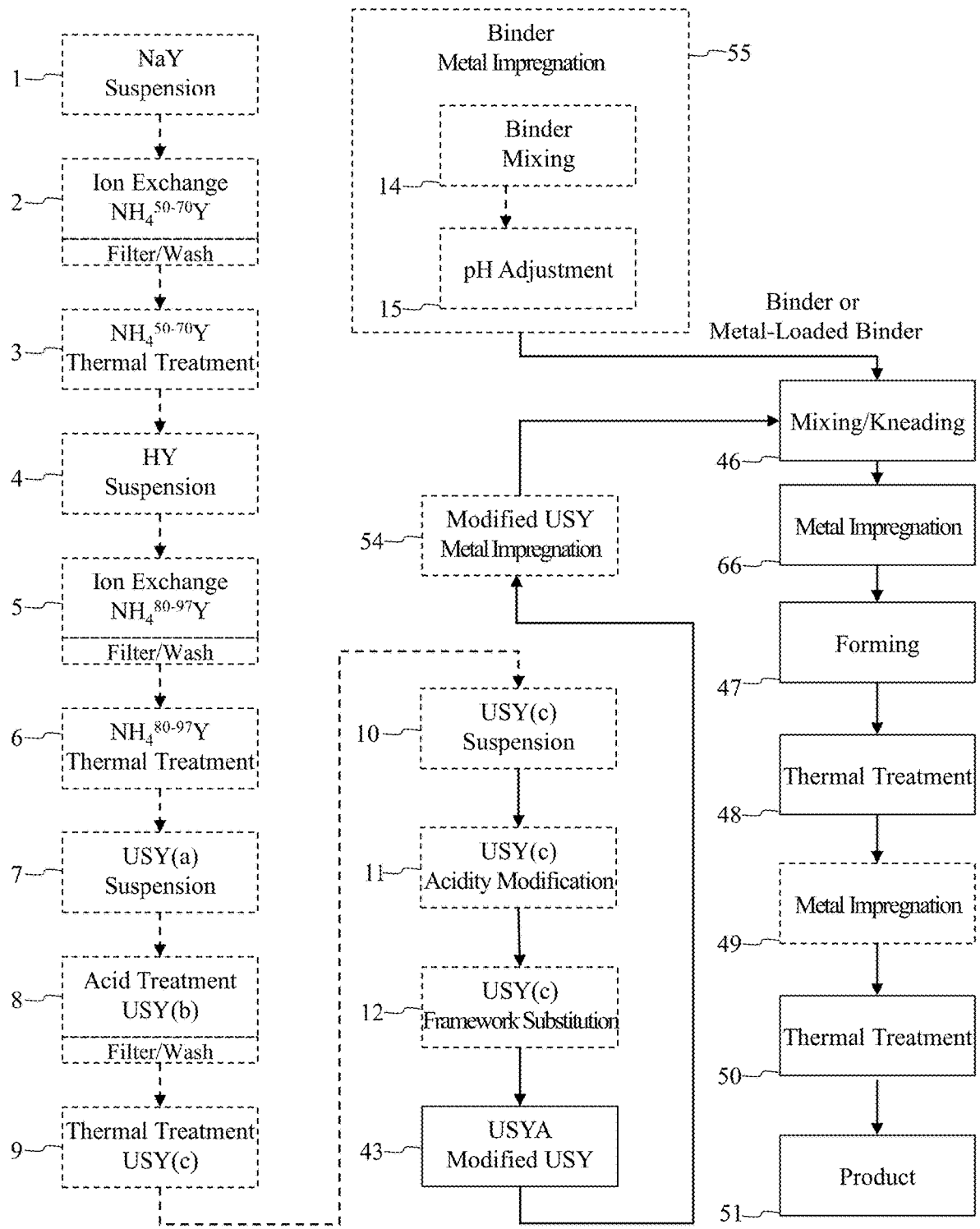
FIG. 6 is a process flow diagram showing possible steps for producing catalyst particles according to various embodiments herein.

With reference to FIGS. 4-6, embodiments for producing catalyst particles having active metal are provided, wherein all or a portion of the metal loading occurs prior to forming the composite catalyst particles. This offers flexibility to the catalyst manufacturer, as will be apparent herein.

In the descriptions herein, the "active metal component" is distinct and separate from the metals that replace the aluminum atoms in the USY zeolite framework, and in particular refers to the one or more metals or metal compounds (oxides or sulfides) that are impregnated in the framework modified zeolite, in the binder, in extrudates of the framework modified zeolite and in the binder, in the calcined extrudates of the framework modified zeolite and in the binder, and combinations thereof.

While not wishing to be bound by theory, it is understood that by controlling the metal loading, by using wet USYA, pore clogging is minimized. If the zeolite has the pores thereof saturated with water, a smaller quantity of metals can diffuse into the pores over a given period of time from a metal solution, as compared to addition of the metal solution to the same zeolite in a dried stated.

In the embodiments described herein, the ratio of the post-framework modified USY zeolite component and the inorganic oxide binder component is appropriately determined according to the object of the catalyst. For example, the post-framework modified USY zeolite content of the catalyst particles formed with the composite support material can be in the range of about 0.1-99, 0.1-90, 0.1-80, 0.1-70, 2-99, 2-90, 2-80, 2-70, 20-100, 20-90, 20-80 or 20-70 wt %, with the remaining content being the inorganic oxide binder, and in certain embodiments optionally one or more other zeolitic materials.

In one embodiment, a method for producing catalyst particles is provided, wherein the catalyst particles are formed from a composite of a granulating agent or binder material such as an inorganic oxide, and a framework substituted USY zeolite material (USYA) in which some of the aluminum atoms in the framework are substituted with zirconium atoms and/or titanium atoms and/or hafnium atoms, and wherein the active metals are impregnated therein prior to forming catalyst particles. In other descriptions of this embodiment, the catalyst particles of this embodiment are referred to as a calcined extrudates of a composite support material of binder and USYA having active metals loaded therein.

FIG. 4 shows process steps for producing said composite catalyst of binder and USYA according to this embodiment in which a mixture of USYA and inorganic oxide are impregnated with the active metal component prior to forming catalyst particles.

In one embodiment of this preparation method, the framework modified zeolite and inorganic oxide as the binder are prepared and/or provided, mixed at the desired ratio and kneaded to form a composite uniform mixture of the materials. The active metal component is added onto the surfaces of the zeolite and the binder, including on the pore internal wall surfaces. The mixture containing the active metal component is then extruded and calcined to form the active metal-containing catalyst particles. The steps 19 and 20 from the process of FIG. 3 are thereby eliminated.

The framework substituted USY zeolite material. USYA, is provided at step 43, as wet, dry (uncalcined) or calcined zeolite material. The underlying framework substituted USY zeolite material and binder material can be provided from any suitable source, including as described hereinabove in conjunction with FIG. 3 or from another source. Steps corresponding to those in FIG. 3 which are considered optional in certain embodiments herein are shown in dashed lines in FIG. 4, and can be carried out as described with respect to FIG. 3. The composite material formed of the zeolite and the inorganic oxide material is characterized by outer surfaces and inner pore wall surfaces. In the embodiment of FIG. 4, the active metals are attached to the outer surfaces and inner pore wall surfaces of the composite material at step 66.

The post-framework modified USY zeolite incorporates one or more of zirconium, titanium, and/or hafnium into its framework, in effective concentrations of about 0.1-5.0, 0.1-4.0, 0.1-3.0, 0.2-5.0, 0.2-4.0, 0.2-3.0, 0.3-5.0, 0.3-4.0 or 0.3-3.0 wt %, as calculated on their oxide basis (that is. $ZrO_2$, $TiO_2$ and/or $HfO_2$ and as measured relative to the mass of the post-framework modified USY zeolite; in certain embodiments, the amounts of individual materials supplying Zr, Ti, and/or Hf can be less than 0.1, 0.2 or 0.3 wt %, but when combined, the total is at least 0.1, 0.2 or 0.3 wt %. In certain embodiments the framework substituted USY zeolite component is provided in a "wet" state, whereby the solid material from the framework substitution step, step 12, is filtered/washed and provided in a wet state, whereby the drying step typically utilized is not carried out (carried out to a lesser degree) so that water remains entrained in the solids. In certain embodiments the framework substituted USY zeolite component is provided in a "dry" state, whereby the solid material from the framework substitution step, step 12, is filtered, and dried, but provided in an uncalcined state, whereby the thermal treatment step to calcine the material that is typically utilized is not carried out. In certain embodiments the framework substituted USY zeolite component is provided in a "dry" state, whereby the solid material from the framework substitution step, step 12, is filtered, dried, and calcined. Accordingly, in the embodiments of FIG. 4, the USYA at step 43 is provided as wet, dry (uncalcined) or calcined zeolite material.

The USYA zeolite material from step 43, in a wet, dry (uncalcined) or calcined state, is combined with the binder support component (e.g., from step 15), shown as a mixing/kneading step 46, which can be carried out as described above with respect to step 16 in FIG. 3. The binder material can be prepared, for example, as shown and described herein with respect to steps 14 and 15 in FIG. 3, or a commercially available inorganic oxide component can be provided, as is known to those skilled in the art. As the inorganic oxide, a porous inorganic oxide used in hydrocracking or other catalyst compositions in the related art can be used. Examples thereof include alumina, silica, titania, silica-alumina, alumina-titania, alumina-zirconia, alumina-boria, phosphorus-alumina, silica-alumina-boria, phosphorus-alumina-boria, phosphorus-alumina-silica, silica-alumina-titania, and silica-alumina-zirconia.

After formation of the composite uniform mixture of the post-framework modified USY zeolite and binder materials at step 46, and before forming into the catalyst particles, an effective quantity of the active metal component is added onto the surfaces, including the pore wall surfaces, of the zeolite and binder material, at step 66. While this is shown as a discrete step, impregnation of active metals in the mixture of the post-framework modified USY zeolite and binder can occur during the mixing and kneading/mulling of the components, or as a separate step thereafter. In certain embodiments, during the mixing and kneading/mulling of the components, all or a portion of water that would typically be used is substituted with an aqueous metal solution as the source of active metal component. In certain embodiments, the active metal component of the final catalyst particles is provided only in the composite uniform mixture of the post-framework modified USY zeolite and binder, therefore the effective quantity encompasses the total active metal content of the final catalyst particles.

The active metal component can include one or more metals or metal compounds (oxides or sulfides) known in the art of hydrocracking, including those selected from the Periodic Table of the Elements IUPAC Groups 6, 7, 8, 9 and 10. In certain embodiments the active metal component is one or more of Mo, W, Co or Ni (oxides or sulfides). In certain embodiments, typically in sulfur-free environments, active metal components include those effective as hydrogenation and/or reforming catalysts such as one or more noble metals Pt, Pd, Rh, Re, Ir, or a combination of such noble metals.

The metal component may be contained in the composite uniform mixture of the post-framework modified USY zeolite and binder material in effective concentrations to provide an effective overall active metal content in the final catalyst particles. Catalysts produced according to the embodiment of FIG. 4 used for hydrocracking, for example hydrocracking of heavy hydrocarbon oil, can contain about 0.01 to 40% by mass of active metal component(s) in terms of metal, oxide or sulfide relative to the total mass of the composite catalyst material, similar to ranges used in conventional hydrocracking catalysts. In the case of non-noble metals, including Mo, W, Co, Ni or combinations thereof, an effective total active metal content can be about 0.1 to 40%, or 3 to 40%, by by mass in terms of oxide or sulfide based on a mass of the catalyst. In the case of noble metals, typically in sulfur-free environments for hydrogenation and/or reforming, an effective total active metal content can be in about 0.01 to 2% by mass in terms of metal.

Several methods can be used to add the active metal component(s) to the support (the composite uniform mixture of the post-framework modified USY zeolite and binder materials), including but not limited to immersion, incipient wetness, and evaporative, or any other suitable method. In certain embodiments an effective quantity of the wet or dry composite uniform mixture is immersed in an excess of solution containing active metals or metal compounds. The solution fills the pores and is also adsorbed on the support surface, and excess solution is removed to recover the metal-loaded composite uniform mixture of support materials. In another method, impregnation is carried out using incipient wetness by tumbling or spraying an effective quantity of support material (the composite uniform mixture of the post-framework modified USY zeolite and binder materials) with a volume of solution having a concentration of metal compound tailored to achieve the targeted metal level. The metal-loaded composite uniform mixture of support materials is recovered. In another method, evaporative impregnation, an effective quantity of support material (the composite uniform mixture of the post-framework modified USY zeolite and binder materials) is saturated with water or with acid solution and immersed into the aqueous solution containing the metal compound. That compound subsequently diffuses into the pores of the support through the aqueous phase. The metal-loaded composite uniform mixture of support materials is recovered.

The quantity and concentration of the aqueous solution containing active metal components added to the composite uniform mixture of the post-framework modified USY zeolite and binder materials is dependent on the desired quantity of the active metal components to be loaded on the composite support particles. In certain embodiments of the above methods, the volume of the active metal solution added to the is equal to or slightly less than the pore volume of the support. The solution is maintained at an effective temperature, for instance about 40-100, 40-99, 60-100, 60-99, 60-97, 70-99, 70-97, 80-99, 80-97 or 90-99° C. and for an effective residence time, for instance in a range of about 40-1200, 40-600, 40-360, 60-1200, 60-600, 60-360, 120-1200, 120-600, 120-360, 180-1200, 180-600, 180-360, or 240-360 minutes.

In certain embodiments, the metal loading can be attained by loading the metal solution of an appropriate concentration up to the available pore volume of the composite uniform mixture of the post-framework modified USY zeolite and binder materials. In further embodiments, a lesser amount is used to control the metal loading. For example, an effective volume of the loading metal solution can be, for instance, in the range of about 1-100, 1-99, 1-90, 20-100, 20-99, or 20-90 V % relative to the total pore volume of the support material.

The kneaded/mulled material thus obtained at step 66 (as a step separate from step 16, or together with the kneading/mulling in step 16) is formed into composite catalyst particles, shown as a forming step 47. The composite catalyst particles are calcined, shown as a thermal treatment step 48, and the final product is recovered, shown as step 51. Steps 46, 47, 48 and 51 shown and described with respect to FIG. 4 can be carried out as described above with respect to steps 16, 17, 18 and 21, respectively, in FIG. 3. As noted above, the steps 19 and 20 from the process of FIG. 3 are thereby eliminated in certain embodiments, and the final composite catalyst particles are a metal-loaded composite of the USYA and the binder support component, which is co-extruded and formed into the catalyst particles.

At step 51, the final catalyst product, calcined catalyst particles, are recovered. The final composite catalyst particles, being calcined extrudates of a composite support material of binder and USYA having active metals loaded therein, generally have surface area and pore volume levels within the ranges of the catalysts formed in the conventional process, for example as described with respect to step 21 in FIG. 3.

Accordingly, the overall process of producing metal-loaded catalyst particles having a composite support of framework substituted USY zeolite material and inorganic oxide is simplified, as the steps 19 and 20 from the process of FIG. 3 are eliminated.

In another embodiment, a method for producing catalyst particles is provided, wherein the catalyst particles are formed from a composite of a granulating agent or binder material such as an inorganic oxide, and a framework substituted USY zeolite material (USYA) in which some of the aluminum atoms in the framework are substituted with zirconium atoms and/or titanium atoms and/or hafnium atoms, wherein the active metals are impregnated in the mixture prior to forming catalyst particles, and further wherein additional active metals are impregnated in the formed catalyst particles. In other descriptions of this embodiment, the catalyst particles of this embodiment are referred to as a calcined metal-loaded extrudates of a composite support material of binder and USYA having active metals loaded therein.

FIG. 5 shows process steps for producing said composite catalyst of binder and USYA having active metals impregnated prior to catalyst forming, and with additional active metals impregnated in the formed extrudate according to this embodiment.

In one embodiment of this preparation method, the framework modified zeolite and inorganic oxide as the binder are prepared and/or provided, mixed at the desired ratio and kneaded to form a composite uniform mixture of the materials. A portion of the active metal component is added onto the zeolite and binder surfaces, including on the pore internal wall surfaces. The metal-loaded composite mixture is extruded and calcined to form the active metal-containing catalyst particles with a first portion of the total active metal content therein. Another portion, of the total active metal component (in certain embodiments the remaining portion)) is added to the extrudate after catalyst particles are formed with the binder, and the metal-loaded composite catalyst particles, having the binder and framework modified zeolite components separately metal-loaded, are calcined to form the final product.

The framework substituted USY zeolite material, USYA, is provided at step 43, as wet, dry (uncalcined) or calcined zeolite material, as described herein with respect to FIG. 4. The underlying framework substituted USY zeolite material and binder material can be provided from any suitable source, including as described hereinabove in conjunction with FIG. 3 or from another source. Steps corresponding to those in FIG. 3 which are considered optional in certain embodiments herein are shown in dashed lines in FIG. 5, and can be carried out as described with respect to FIG. 3. The composite material formed of the zeolite and the inorganic oxide material is characterized by outer surfaces and inner pore wall surfaces. In addition, the formed extrudate is characterized by outer surfaces and inner pore wall surfaces. In the embodiment of FIG. 5, the active metals are attached to the outer surfaces and inner pore wall surfaces of the composite material at step 66, and additional metals attach to the outer surfaces and inner pore wall surfaces of the formed extrudate at step 49.

As with the embodiment of FIG. 4. USYA zeolite material from step 43, in a wet, dry (uncalcined) or calcined state, is combined with the binder support component (e.g., from step 15), shown as a mixing/kneading step 46, which can be carried out as described above with respect to step 16 in FIG. 3. After formation of the composite uniform mixture of the post-framework modified USY zeolite and binder materials at step 46, and before forming into the catalyst particles, an effective quantity of the active metal component is added onto the surfaces, including the pore wall surfaces, of the zeolite and binder material, at step 66. In the embodiment of FIG. 5, only a portion of the active metal content is loaded at this step. The quantity of the active metal component at step 66 is a first portion of the total active metal component content contained in the final composite catalyst particles, and a second portion of the total active metal component content is impregnated in the extrudates at step 49 described below.

The first portion added to the composite support component can be, for instance, about 1-99, 1-90, 1-70, 1-60, 1-99, 5-90, 5-70, 5-60, 20-99, 20-90, 20-70, 20-60, 40-99, 40-90, 40-70, or 40-60% by mass of the total active metal component content contained in the final composite catalyst particles, with the remainder of the total active metal made up in the second portion of the of active metal component content that is impregnated in the extrudates as the formed composite support component.

The composite catalyst particles, having a first portion of the active metal component in the composite support component, and after subjecting to thermal treatment at step 48, are subjected to an impregnation step 49, wherein the second portion of the total active metal component content is impregnated in the composite extrudate particles as the support. The second portion is an effective quantity to make up the difference to attain the requisite total active metal component content. In certain embodiments an effective quantity of composite extrudate particles are immersed in an excess of solution containing active metals or metal compounds. The solution fills the pores and is also adsorbed on the support surface, and excess solution is removed to recover the metal-loaded composite. The metal-loaded composite catalyst particles from step 49 are calcined, shown as a thermal treatment step 50, and the final product, calcined catalyst particles, are recovered, shown as step 51.

Several methods can be used to add the additional active metal component(s) to the metal-loaded composite extrudate particles, as the calcined metal-loaded support from step 48, including but not limited to immersion, incipient wetness, and evaporative. The impregnation of the once metal-loaded composite extrudate particles can follow the procedures used in conventional methods, for instance descried in conjunction with step 19 in FIG. 3. A difference is that in the method herein this step requires that only the second portion of the total active metal component content, rather than the entire active metal content as in the conventional methods, to provide the twice metal-loaded composite extrudate particles.

The procedure for the thermal treatment step 50 can follow those used in conventional methods, for instance descried in conjunction with step 20 in FIG. 3. At step 51, the final catalyst product is recovered. The final composite catalyst particles, being calcined metal-loaded extrudates of a composite support material of binder and USYA having active metals loaded therein, generally have surface area and pore volume levels within the ranges of the catalysts formed in the conventional process, for example as described with respect to step 21 in FIG. 3.

In additional embodiments, and with reference generally to FIG. 6, methods for producing catalyst particles is provided, wherein the catalyst particles are formed from a composite of a granulating agent or binder material such as an inorganic oxide, and a framework substituted USY zeolite material (USYA) in which some of the aluminum atoms in the framework are substituted with zirconium atoms and/or titanium atoms and/or hafnium atoms. The active metals are impregnated in a composite of binder and USYA, step 66 as described herein, and (a) an inorganic oxide binder, step 55 (in the absence of the metal impregnation step 49) as described herein and in co-pending U.S. patent application Ser. No. 17/577,747 filed on Jan. 18, 2022, entitled "Catalysts With Modified Active Phase Dispersion And Method To Prepare Catalysts With Modified Active Phase Dispersion", which is incorporated by reference herein in its entirety;

(b) a USYA zeolite to form USYA(m), step 54 (in the absence of the metal impregnation step 49) as described herein and in co-pending U.S. patent application Ser. No. 17/577,691 filed on Jan. 18, 2022, entitled "Catalysts With Modified Active Phase Dispersion And Method To Prepare Catalysts With Modified Active Phase Dispersion", which is incorporated by reference herein in its entirety; or (c) both (a) and (b) above.

Alternatively, the active metals are impregnated in a composite of binder and USYA, step 66 as described herein, and (a) one of (a1) an inorganic oxide binder, step 55 (in the absence of the metal impregnation step 49) as described herein and in U.S. patent application Ser. No. 17/577,747 filed on Jan. 18, 2022, entitled "Catalysts With Modified Active Phase Dispersion And Method To Prepare Catalysts With Modified Active Phase Dispersion", which is incorporated by reference herein in its entirety;

(a2) a USYA zeolite to form USYA(m), step 54 (in the absence of the metal impregnation step 49) as described herein and in U.S. patent application Ser. No. 17/577,691 filed on Jan. 18, 2022, entitled "Catalysts With Modified Active Phase Dispersion And Method To Prepare Catalysts With Modified Active Phase Dispersion", which is incorporated by reference herein in its entirety; or (a3) both (a1) and (a2) above;

and (b) in the extrudate intermediate catalyst particles, step 49, formed from one of the above (a1), (a2) or (a3).

FIG. 6 shows process steps for producing said composite catalyst with active metals impregnated at one or more stages. The procedures for the individual steps can follow those described herein with respect to FIGS. 3-5, with certain steps as further described in co-pending U.S. patent application Ser. No. 17/577,691 filed on Jan. 18, 2022 and entitled "Catalysts With Modified Active Phase Dispersion And Method To Prepare Catalysts With Modified Active Phase Dispersion", and/or Ser. No. 17/577,747 filed on Jan. 18, 2022, entitled "Catalysts With Modified Active Phase Dispersion And Method To Prepare Catalysts With Modified Active Phase Dispersion", which are both incorporated by reference herein in their entireties.

In any of the above-described embodiments, one or more additional zeolitic components (that is, a zeolite material other than the post-framework modified USY zeolite or metal-loaded post-framework modified USY zeolite) can be integrated, for instance at step in which the post-framework modified USY zeolite or the metal-loaded post-framework modified USY zeolite is mixed with inorganic oxide. Said additional zeolitic material can include but is not limited to mordenite, ZSM-5, ZSM-11, ZSM-12, ZSM-22, ZSM-23, ZSM 35, beta-type, Y and USY (wherein this USY zeolitic component is not the same as the post-framework modified USY zeolite described herein). For example, these can be (FAU) framework, which includes USY, having a micropore size related to the 12-member ring when viewed along the [111] direction of 7.4×7.4 Å; (MFI) framework, which includes ZSM-5, having a micropore size related to the 10-member rings when viewed along the [100] and [010] directions of 5.5×5.1 Å and 5.6×5.3 Å, respectively; (MEL) framework, which includes ZSM-11, having a micropore size related to the 10-member ring when viewed along the [100] direction of 5.4×5.3 Å: (MTW) framework, which includes ZSM-12, having a micropore size related to the 12-member ring when viewed along the [010] direction of 5.6×6.0 Å; (TON) framework, which includes ZSM-12, having a micropore size related to the 10-member ring when viewed along the [001] direction of 4.6×5.7 Å: (MTT) framework, which includes ZSM-23, having a micropore size related to the 10-member ring when viewed along the [001] direction of 4.5×5.2 Å, (FER) framework, which includes ZSM-35, having a micropore size related to the 10-member ring and 8-member ring when viewed along the [001] and [010] directions of 4.2×5.4 Å and 3.5×4.8 Å, respectively, (MOR) framework, which includes mordenite zeolites, having a micropore size related to the 12-member ring and 8-member ring when viewed along the [001] and [001] directions of 6.5×7.0 Å and 2.6×5.7 Å, respectively; and (*BEA) framework, which includes zeolite beta polymorph A, having a micropore size related to the 12-member rings when viewed along the [100] and [001] directions of 6.6×6.7 Å and 5.6×5.6 Å, respectively.

A method for hydrocracking hydrocarbon oil is provided herein, including hydrocracking hydrocarbon oil with the hydrocracking catalyst described above.

In certain embodiments, a method for hydrocracking hydrocarbon oil comprises filling a reactor vessel of a hydrocracking apparatus which is a flow reactor with the hydrocracking catalyst, and treating a hydrocarbon oil, for instance having a boiling point in the range of about 370-816, 370-650° C. in the presence of hydrogen, at a reactor temperature in the range of about 300-500, 330-450° C., a hydrogen partial pressure in the range of about 4-30, 7-15 MPa, a liquid hourly space velocity (LHSV) in the range of about 0.1-10, 0.2-1.5 $h^{-1}$, and a hydrogen/oil ratio of in the range of about 500-2500, 1000-2000 normalized cubic meters of hydrogen per cubic meter of oil ($Nm^3/m^3$).

In certain embodiments, a method for hydrocracking hydrocarbon oil comprises filling a reactor vessel of a hydrocracking apparatus which is a flow reactor with the hydrocracking catalyst, and treating a hydrocarbon oil having a boiling point in the range of about 370-650° C. in the presence of hydrogen at a reactor temperature in the range of about 330-450° C. a hydrogen partial pressure in the range of about 7-15 MPa, a LHSV in the range of about 0.2-1.5 $h^{-1}$, and a hydrogen/oil ratio of in the range of about 1000-2000 $Nm^3/m^3$ to afford kerosene-gas oil.

In the method for hydrocracking hydrocarbon oil according to the present invention, the flow reactor described above can be a flow reactor selected from a stirring bath type reactor, a boiling bed type reactor, a baffle-equipped slurry bath type reactor, a fixed bed type reactor, a rotary tube type reactor and a slurry bed type reactor.

In the method for hydrocracking hydrocarbon oil according to the present invention, the hydrocarbon oil described above contains preferably heavy hydrocarbon oil obtained from (1) crude oil. (2) synthetic crude oil, (3) bitumen, (4) oil sand, (5) shell oil or (6) coal liquid.

In the method for hydrocracking hydrocarbon oil according to certain embodiments the present invention, the hydrocarbon oil described above contains heavy hydrocarbon oil obtained from crude oil, synthetic crude oil, bitumen, oil sand, shell oil or coal liquid, and the above heavy hydrocarbon oil is preferably any of a) vacuum gas oil (VGO), b) deasphalted oil (DAO) obtained from a solvent deasphalting process or demetallized oil, c) light coker gas oil or heavy coker gas oil obtained from a coker process, d) cycle oil obtained from a fluid catalytic cracking (FCC) process or e) gas oil obtained from a visbreaking process.

The hydrocracking catalyst for hydrocarbon oil manufactured according to the present invention is characterized by that in a hydrocracking catalyst for hydrocarbon oil containing an ultra-stable Y-type zeolite, the above ultra-stable Y-type zeolite is the framework-substituted zeolite in which a part of aluminum atoms constituting a framework thereof is substituted with zirconium atoms and/or titanium and/or hafnium atoms. Hydrogenative active metal components are provided, are provided, wherein all or a portion of the metal loading occurs prior to forming the composite catalyst particles, as described herein.

Accordingly, the hydrocracking catalyst of the present invention makes it easy to diffuse heavy hydrocarbons such as VGO. DAO and the like into mesopores thereof as compared with conventional hydrocracking catalysts comprising a support of a zeolite on which titanium fine particles or zirconium fine particles are carried, and a cracking activity of hydrocarbon oil is enhanced to make it possible to obtain middle distillates at high yields. Using the hydrocracking catalyst of the present invention, clogging of the mesopores is minimized enhancing the ability of the heavy hydrocarbons to diffuse therein for catalytic reaction.

Further, the hydrocracking catalyst of the present invention has a slightly low cracking activity of hydrocarbon oils as compared with those of conventional hydrocracking catalysts comprising a hydrogenative metal component carried on a support comprising a framework-substituted zeolite in which apart of aluminum atoms constituting a framework of a Y-type zeolite is substituted with titanium atoms, but an excessive cracking reaction of kerosene and gas oil is inhibited, so that middle distillates can be obtained at high yields. Also, the hydrocracking catalyst for hydrocarbon oil according to the present invention is increased the number of active sites and therefore is provided with a high hydrocracking activity.

EXAMPLES

Comparative Example

The comparative example provides a method of producing reference catalyst particles, which are calcined composite support particles of the post-framework modified USY zeolite described herein and a binder, having active metal component added to the particles, and subsequently calcined. The process is similar to that disclosed in the '036 patent family.

First, 50.0 kg of a Na—Y zeolite having a SAR of 5.2, a UD of 2.466 nm, a SA of 720 m$^2$/g, and a Na$_2$O content of 13.0% by mass, was suspended in water (liquid/solid mass ratio of 12.5 L of water per kg of zeolite) at a temperature of 60° C. Then, 14.0 kg of ammonium sulfate was added thereto. The resulting suspension was stirred at 70° C. for 1 hour and filtered. The resulting solid was washed with water. Then the solid was washed with an ammonium sulfate solution of 14.0 kg of ammonium sulfate dissolved in 500 L of water having a temperature of 60° C. washed with 500 L of water having a temperature of 60° (C, dried at 130° C. for 20 hours, thereby affording about 45 kg of a Y zeolite (NH$_4^{65}$Y) in which 65% of sodium (Na) contained in Na—Y was ion-exchanged with ammonium ion (NH$_{41}$). The content of Na$_2$O in NH$_4^{65}$Y was 4.5% by mass. Next, 40 kg of NH$_4^{65}$Y was fired in a saturated water vapor atmosphere at 670° C. for 1 hour to form a hydrogen-Y zeolite (HY).

40 kg of HY was suspended in 400 L of water having a temperature of 60° C. Then, 49.0 kg of ammonium sulfate was added thereto. The resulting mixture was stirred at 90° C. for 1 hour and washed with 200 L of water having a temperature of 60° C. The mixture was then dried at 130° C. for 20 hours, thereby affording about 37 kg of a Y zeolite (NH$_4^{95}$Y) in which 95% of Na contained in the initial Na—Y was ion-exchanged with NH$_4$. About 33 kg of the synthesized NH$_4^{95}$Y was fired in a saturated water vapor atmosphere at 650° C. for 1 hour, thereby affording about 15 kg of an ultra stable Y zeolite (hereinafter, also referred to as "USY(a)") having a SiO$_2$/Al$_2$O$_3$ molar ratio of 5.2 and a Na$_2$O content of 0.6% by mass.

40 kg of USY(a)) is suspended in 400 L of water at 60° C. 25% by mass sulfuric acid, at 2.35 times the zeolite amount thereto, was gradually added to the suspension and stirred for one hour to dissolve extraskeletal aluminum and to prepare the second USY zeolite (USY(b)). Then, the suspension was filtrated, and a matter obtained was washed with 20 liter of purified water at 60° C. and dried at 130° C. for 20 hours to obtain the solid matter, USY(b). The USY(b) is fired at 600° C. for 1 hour to thereby prepare an ultrastable Y-type zeolite (USY(c)).

1 kg of the USY(c) is suspended in 10 Lt of water at 25° C. The pH of the suspension is adjusted to 1.6 by gradually adding 25% by mass sulfuric acid. Then 86 g of a solution containing 18% zirconium sulfate by mass and 45 g of a solution containing 33% titanium sulfate by mass was added thereto. The resulting mixture was stirred for 3 hours at room temperature. Then the pH was adjusted to 7.2 with 15% aqueous ammonia by mass. After the mixture was stirred for 1 hour at room temperature, the mixture was filtered. The resulting solid was washed with 10 L of water and dried at 130° C. for 20 hours, thereby affording about 1 kg of a titanium-zirconium-substituted zeolite (Ti—Zr—USY).

To prepare an alumina binder, 40 kg of an aqueous solution of 6.8% sodium aluminate by mass on an Al$_2$O$_3$ basis was mixed with 40 kg of an aqueous solution of 2.4% aluminum sulfate by mass on an Al$_2$O$_3$ basis. Further, the mixture was stirred at 60° C. for 1 hour, and then the product was washed with 150 Lt of a 0.3 mass % ammonia aqueous solution to remove Na$_2$SO$_4$. Next, water was added to the product from which Na$_2$SO$_4$ was removed to adjust an Al$_2$O$_3$ concentration to 10% by mass. The pH was adjusted to 10.5 with 15% aqueous ammonia by mass. The mixture was stirred at 95° C. for 10 hours, dehydrated, washed, and kneaded with a kneader, thereby providing an alumina mixture.

The alumina knead product thus prepared was mixed with the Ti—Zr—USY zeolite at a dry mass ratio of 3:7. The mixture was formed into a columnar shape having a diameter of 1.8 mm, and fired at 550° C. for 3 hours, thereby preparing calcined composite particles.

The hydrogenative active metal component was next added to the calcined composite particles. An aqueous solution containing hydrogenative-active metal components was prepared by adding 700 mL of water to 200 g of molybdenum trioxide (an example of the hydrogenative-active metal component) and 91 g of nickel carbonate (an example of the hydrogenative-active metal component). The aqueous solution was mixed with 500 g of the calcined composite particles (the composite of Ti—Zr—USY zeolite and alumina) and dried at 250° C. for 1 hour. The recovered mixture was fired at 550° C. for 3 hours to prepare the calcined composite particles with active phase material, and recovered, thereby affording about 0.5 kg of the reference catalyst.

Example 1

The process of the comparative example was followed to obtain the titanium-zirconium-substituted zeolite, Ti—Zr—USY (in a dried state) and the alumina mixture. The Ti—Zr—USY zeolite and alumina were mixed at a dry mass ratio of 3:7, and the mixture was kneaded. An aqueous solution containing hydrogenative-active metal components was prepared by adding 580 mL of water to 240 g of molybdenum trioxide (an example of the hydrogenative-active metal component) and 110 g of nickel carbonate (an example of the hydrogenative-active metal component). The aqueous solution of the active metal component was mixed with 1200 g of the kneaded mixture of alumina and Ti—Zr—USY zeolite. The thus-formed mixture was formed into a columnar shape having a diameter of 1.8 mm, and fired at 550° (C for 3 hours, and about 1.3 kg of the catalyst particles was recovered, the catalyst particles being calcined extrudates of a composite support material of binder and USYA having active metals loaded therein.

Example 2

The process of the comparative example was followed to obtain the titanium-zirconium-substituted zeolite. Ti—Zr—USY (in a dried state) and the alumina mixture. The Ti—Zr—USY zeolite and alumina were mixed at a dry mass ratio of 1:1, and the mixture was kneaded. An aqueous solution containing hydrogenative-active metal components was prepared by adding 30) mL of water to 100 g of molybdenum trioxide (an example of the hydrogenative-active metal component) and 45 g of nickel carbonate (an example of the hydrogenative-active metal component). Half of the aqueous solution of the active metal component was mixed with 500 g of the mixture of alumina and Ti—Zr—USY zeolite, thereby affording about 0.5 kg of the composite support material loaded with active metals. The mixture was formed into a columnar shape having a diameter of 1.8 mm, and fired at 550° C. for 3 hours, and about 0.5 kg of the intermediate catalyst particles was recovered.

Next, the remaining portion of the aqueous solution containing hydrogenative-active metal components was mixed with 0.5 g of the calcined intermediate catalyst particles (the metal-loaded composite of the Ti—Zr—USY zeolite and alumina) and dried at 250° C. for 1 hour. The recovered mixture was fired at 550° C. for 1 hour, and about 0.5 kg of the catalyst particles was recovered, the catalyst particles being calcined metal-loaded extrudates where said extrudate is formed from a metal-loaded composite of Ti—Zr—USY zeolite and alumina.

The method and system of the present invention have been described above, however, modifications will be apparent to those of ordinary skill in the art and the scope of protection for the invention is to be defined by the claims that follow.

The invention claimed is:

1. A method for making catalyst particles comprising:
providing post-framework modified ultra-stable Y-type (USY) zeolite in which a portion of aluminum atoms constituting a zeolite framework thereof is substituted with zirconium atoms and/or titanium atoms and/or hafnium atoms, wherein the post-framework modified USY zeolite is characterized by outer surfaces and pores which define inner surfaces;
impregnating a first portion of a total active metal component content of one or more active metal components on outer surfaces and/or on pore inner surfaces of the post-framework modified USY zeolite to form metal-loaded post-framework modified USY zeolite;
providing an inorganic oxide as a binder;
mixing and kneading the metal-loaded post-framework modified USY zeolite with the inorganic oxide binder to form a composite of post-framework modified USY zeolite and inorganic oxide binder, wherein the composite is characterized by outer surfaces and inner pore wall surfaces;
impregnating a second portion of the total active metal component content of the one or more active metal components on outer surfaces and/or on pore inner surfaces of the composite to form a metal-loaded composite of metal-loaded post-framework modified USY zeolite and inorganic oxide binder;
forming the catalyst particles from the metal-loaded composite of metal-loaded post-framework modified zeolite and inorganic oxide binder into extrudates;
thermally treating the extrudates; and
recovering calcined catalyst particles.

2. The method as in claim 1, wherein the pores of said post-framework modified USY zeolite define a volume, wherein impregnating one or more active metal components uses a metal in a liquid solution, and wherein the volume of said liquid solution is up to the pore volume of said post-framework modified USY zeolite.

3. A method for making catalyst particles comprising:
providing post-framework modified ultra-stable Y-type (USY) zeolite in which a portion of aluminum atoms constituting a zeolite framework thereof is substituted with zirconium atoms and/or titanium atoms and/or hafnium atoms;
providing an inorganic oxide as a binder;
mixing and kneading the post-framework modified USY zeolite with the inorganic oxide binder to form a composite of post-framework modified USY zeolite and inorganic oxide binder, wherein the composite is characterized by outer surfaces and inner pore wall surfaces;
impregnating one or more active metal components as a first portion of a total active metal component content on outer surfaces and/or on pore inner surfaces of composite to form a metal-loaded composite of post-framework modified USY zeolite and inorganic oxide binder;
forming the catalyst particles from the metal-loaded composite of post-framework modified zeolite and inorganic oxide binder into extrudates;

thermally treating the extrudates;
recovering intermediate calcined catalyst particles that are characterized by outer surfaces and pores which define inner surfaces;
impregnating one or more active metal components as a second portion of the total active metal component content on outer surfaces and/or on pore inner surfaces of the intermediate calcined catalyst particles;
thermally treating the metal-loaded intermediate calcined catalyst particles; and
recovering final calcined catalyst particles.

4. The method of manufacturing catalyst particles as in claim 3, wherein said post-framework modified USY zeolite is provided in wet, dried or calcined state.

5. The method of manufacturing catalyst particles as in claim 3, wherein said post-framework modified USY zeolite contains from 0.1 to 5 mass % zirconium and/or titanium and/or hafnium as calculated as the oxide basis.

6. The method of manufacturing catalyst particles as in claim 3, wherein said inorganic oxide material is selected from the group consisting of alumina, silica, titania, silica-alumina, alumina-titania, alumina-zirconia, alumina-boria, phosphorus-alumina, silica-alumina-boria, phosphorus-alumina-boria, phosphorus-alumina-silica, silica-alumina-titania, and silica-alumina-zirconia.

7. The method of manufacturing catalyst particles as in claim 3, wherein said post-framework modified USY zeolite comprises about 0.1-99 wt % of the composite, wherein a remaining mass comprises the inorganic oxide component.

8. The method of manufacturing catalyst particles as in claim 3, wherein said catalyst particles are formed of post-framework modified USY zeolite, the inorganic oxide component and an additional zeolite component.

9. The method of manufacturing catalyst particles as in claim 8, wherein said post-framework modified USY zeolite comprises about 0.1-99 wt % of the catalyst particles, wherein a first remaining mass comprises the inorganic oxide component and a second remaining mass comprises the additional zeolite component.

10. The method of manufacturing catalyst particles as in claim 3, wherein said active metal component is selected from the group of metals consisting of platinum, palladium and rhenium, and wherein said active metal component is present in an amount from 0.01-2 wt % in terms of the mass of the active metal component based on the mass of the catalyst particles.

11. The method of manufacturing catalyst particles as in claim 3, wherein said active metal component is selected from the group of metals consisting of Mo, W, Co, Ni and combinations thereof, and wherein said active metal component is present in an amount from 0.1-40 wt % in terms of the mass of the active metal component based on the mass of the catalyst particles.

12. Calcined catalyst particles comprising a composite of post-framework modified ultra-stable Y-type (USY) zeolite in which a portion of aluminum atoms constituting a zeolite framework thereof is substituted with zirconium atoms and/or titanium atoms and/or hafnium atoms, and
inorganic oxide binder material,
wherein the composite is characterized by outer surfaces and pores which define inner surfaces, and wherein said outer surfaces and/or pore inner surfaces are metal-loaded with a first portion of a total active metal component content of one or more active metal components, as metal-loaded composite;
wherein said metal-loaded composite is formed into extrudates and thermally treated as intermediate calcined catalyst particles; and
wherein the intermediate calcined catalyst particles are metal-loaded with a second portion of the total active metal component content of one or more active metal components, as the calcined catalyst particles.

13. The calcined catalyst particles as in claim 12, wherein said framework modified zeolite substituted with 0.1-5 mass % zirconium atoms and 0.1-5 mass % titanium ions calculated on an oxide basis.

14. The calcined catalyst particles as in claim 12, wherein said framework-modified USY zeolite has the following characteristics: (a) a crystal lattice constant of 2.430 to 2.450 nm, (b) a specific surface area of 600 to 900 m$^2$/g, and (c) a molar ratio of $SiO_2$ to $Al_2O_3$ of 12 to 100.

15. The calcined catalyst particles as in claim 12, having a specific surface area of 200 to 450 m$^2$/g; a volume of pores having a diameter of 600 Å or less of 0.40 to 0.75 ml/g; and wherein the one or more active metal components are 0.01 to 40 mass % relative to the total mass of the calcined catalyst particles.

16. The calcined catalyst particles as in claim 12, wherein said active metal component is selected from the group of metals consisting of platinum, palladium and rhenium, and wherein said active metal component is present in an amount from 0.01-2 wt % in terms of the mass of the active metal component based on the mass of the catalyst particles.

17. The calcined catalyst particles as in claim 12, wherein said active metal component is selected from the group of metals consisting of Mo, W, Co, Ni and combinations thereof, and wherein said active metal component is present in an amount from 0.1-40 wt % in terms of the mass of the active metal component based on the mass of the catalyst particles.

18. A method for making catalyst particles comprising:
providing post-framework modified ultra-stable Y-type (USY) zeolite in which a portion of aluminum atoms constituting a zeolite framework thereof is substituted with zirconium atoms and/or titanium atoms and/or hafnium atoms;
providing an inorganic oxide as a binder that is characterized by outer surfaces and pores which define inner surfaces;
impregnating a first portion of a total active metal component content of one or more active metal components on outer surfaces and/or on pore inner surfaces of the inorganic oxide binder material to form metal-loaded inorganic oxide binder;
mixing and kneading the post-framework modified USY zeolite with the metal-loaded inorganic oxide binder to form a composite of post-framework modified USY zeolite and inorganic oxide binder, wherein the composite is characterized by outer surfaces and inner pore wall surfaces;
impregnating a second portion of the total active metal component content of the one or more active metal components on outer surfaces and/or on pore inner surfaces of the composite to form a metal-loaded composite of post-framework modified USY zeolite and metal-loaded inorganic oxide binder;
forming the catalyst particles from the metal-loaded composite of post-framework modified zeolite and metal-loaded inorganic oxide binder into extrudates;
thermally treating the extrudates; and
recovering calcined catalyst particles.

19. Calcined catalyst particles comprising a composite of
post-framework modified ultra-stable Y-type (USY) zeolite in which a portion of aluminum atoms constituting a zeolite framework thereof is substituted with zirconium atoms and/or titanium atoms and/or hafnium atoms, wherein the post-framework modified USY zeolite is characterized by outer surfaces and pores which define inner surfaces, and wherein said outer surfaces and/or pore inner surfaces of the post-framework modified USY zeolite are metal-loaded with a first portion of a total active metal component content of one or more active metal components; and inorganic oxide binder material, wherein the composite is characterized by outer surfaces and pores which define inner surfaces, and wherein said outer surfaces and/or pore inner surfaces of the composite are metal-loaded with a second portion of the total active metal component content of one or more active metal components, as metal-loaded composite;

wherein said metal-loaded composite is formed into extrudates and thermally treated as the calcined catalyst particles.

20. Calcined catalyst particles comprising a composite of
post-framework modified ultra-stable Y-type (USY) zeolite in which a portion of aluminum atoms constituting a zeolite framework thereof is substituted with zirconium atoms and/or titanium atoms and/or hafnium atoms; and inorganic oxide binder material, wherein the inorganic oxide binder material is characterized by outer surfaces and pores which define inner surfaces, and wherein said outer surfaces and/or pore inner surfaces of the inorganic oxide binder material are metal-loaded with a first portion of a total active metal component content of one or more active metal components;

wherein the composite is characterized by outer surfaces and pores which define inner surfaces, and wherein said outer surfaces and/or pore inner surfaces of the composite are metal-loaded with a second portion of the total active metal component content of one or more active metal components, as metal-loaded composite;

wherein said metal-loaded composite is formed into extrudates and thermally treated as the calcined catalyst particles.

* * * * *